(12) United States Patent
Suganuma et al.

(10) Patent No.: US 11,500,194 B2
(45) Date of Patent: Nov. 15, 2022

(54) BEAM DELIVERY SYSTEM, FOCAL LENGTH SELECTING METHOD, AND ELECTRONIC DEVICE MANUFACTURING METHOD

(71) Applicant: Gigaphoton Inc., Tochigi (JP)

(72) Inventors: Takashi Suganuma, Oyama (JP);
Takahiro Tatsumi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 266 days.

(21) Appl. No.: 17/036,412

(22) Filed: Sep. 29, 2020

(65) Prior Publication Data

US 2021/0149185 A1    May 20, 2021

(30) Foreign Application Priority Data

Nov. 18, 2019   (JP) .............................. JP2019-207792

(51) Int. Cl.
*H05G 2/00*        (2006.01)
*G02B 26/08*       (2006.01)
(Continued)

(52) U.S. Cl.
CPC ........... *G02B 26/0825* (2013.01); *G02B 5/10* (2013.01); *G02B 19/0047* (2013.01); *H05G 2/008* (2013.01)

(58) Field of Classification Search
CPC ...................................................... H05G 2/008
See application file for complete search history.

(56) References Cited

U.S. PATENT DOCUMENTS

2013/0037693 A1   2/2013   Moriya et al.
2013/0320244 A1   12/2013  Frihauf et al.
(Continued)

FOREIGN PATENT DOCUMENTS

JP    2012-178534 A    9/2012
WO    2014-097811 A1   6/2014
(Continued)

OTHER PUBLICATIONS

A Search Report issued by the Netherlands Patent Office dated Apr. 14, 2021, which corresponds to Dutch Patent Application No. 2026637 and is related to U.S. Appl. No. 17/036,412; with partial English language explanation.

(Continued)

*Primary Examiner* — Vip Patel
(74) *Attorney, Agent, or Firm* — Studebaker & Brackett PC

(57) ABSTRACT

A beam delivery system according to an aspect of the present disclosure is used for an extreme ultraviolet light generation apparatus and includes a propagation mirror disposed on an optical path between a laser apparatus and a condensation optical system and configured to change the propagation direction of a pulse laser beam, and a curvature mirror disposed on an optical path between the propagation mirror and the condensation optical system and having a concave reflective surface configured to convert the pulse laser beam to be incident on the condensation optical system into a convergent beam. The curvature mirror has a focal length selected so that the beam spread angle of the pulse laser beam from the curvature mirror is constant irrespective of thermal deformation of the propagation mirror or constant with change in a predetermined allowable range irrespective of thermal deformation of the propagation mirror.

19 Claims, 17 Drawing Sheets

(51) Int. Cl.
    *G02B 5/10*         (2006.01)
    *G02B 19/00*      (2006.01)

(56) References Cited

U.S. PATENT DOCUMENTS

| | | |
|---|---|---|
| 2015/0250045 A1 | 9/2015 | Tao et al. |
| 2015/0264792 A1 | 9/2015 | Suzuki et al. |
| 2017/0280544 A1 | 9/2017 | Ueno et al. |

FOREIGN PATENT DOCUMENTS

| | | |
|---|---|---|
| WO | 2016/125295 A1 | 8/2016 |
| WO | 2016/150612 A2 | 9/2016 |

OTHER PUBLICATIONS

John C. Ion; "Laser Processing of Engineering Materials"; Jan. 1, 2005, Elsevier, XP040425979.

BEAM DELIVERY SYSTEM, FOCAL LENGTH SELECTING METHOD, AND ELECTRONIC DEVICE MANUFACTURING METHOD

CROSS-REFERENCE TO RELATED APPLICATIONS

The present application claims the benefit of Japanese Patent Application No. 2019-207792, filed on Nov. 18, 2019, the entire contents of which are hereby incorporated by reference.

BACKGROUND

1. Technical Field

The present disclosure relates to a beam delivery system, a focal length selecting method, and an electronic device manufacturing method.

2. Related Art

Recently, miniaturization of a transfer pattern in optical lithography of a semiconductor process has been rapidly proceeding along with miniaturization of the semiconductor process. Minute fabrication at 10 nm or smaller will be requested in the next generation technology. To meet the request for minute fabrication at 10 nm or smaller, for example, it is desired to develop a semiconductor exposure apparatus including an extreme ultraviolet light generation apparatus configured to generate extreme ultraviolet (EUV) light at a wavelength of 13 nm approximately in combination with reduced projection reflective optics.

EUV light generation apparatus being developed include a laser produced plasma (LPP) device that uses plasma generated by irradiating a target material with a laser beam.

LIST OF DOCUMENTS

Patent Documents

Patent Document 1: Japanese Unexamined Patent Application Publication No. 2012-178534
Patent Document 2: US Published Patent Application No. 2013/0320244
Patent Document 3: International Patent Publication No. 2014/097811
Patent Document 4: International Patent Publication No. 2016/125295

SUMMARY

A beam delivery system according to an aspect of the present disclosure guides, to a condensation optical system, a pulse laser beam emitted from a laser apparatus and is used for an extreme ultraviolet light generation apparatus configured to generate extreme ultraviolet light by irradiating a target substance with the pulse laser beam through the condensation optical system. The beam delivery system includes a propagation mirror disposed on an optical path between the laser apparatus and the condensation optical system and configured to change the propagation direction of the pulse laser beam; and a curvature mirror disposed on an optical path between the propagation mirror and the condensation optical system and having a concave reflective surface configured to convert the pulse laser beam to be incident on the condensation optical system into a convergent beam. The curvature mirror has a focal length selected so that the pulse laser beam as the convergent beam from the curvature mirror has a beam spread angle that is constant irrespective of thermal deformation of the propagation mirror or constant with change in a predetermined allowable range irrespective of thermal deformation of the propagation mirror.

A focal length selecting method according to another aspect of the present disclosure selects the focal length of a curvature mirror included in a beam delivery system that guides, to a condensation optical system, a pulse laser beam emitted from a laser apparatus and is used for an extreme ultraviolet light generation apparatus configured to generate extreme ultraviolet light by irradiating a target substance with the pulse laser beam through the condensation optical system. The beam delivery system has a configuration in which a propagation mirror configured to change the propagation direction of the pulse laser beam is disposed on an optical path between the laser apparatus and the condensation optical system, and the curvature mirror having a concave reflective surface is disposed on an optical path between the propagation mirror and the condensation optical system so that a convergent beam from the curvature mirror is incident on the condensation optical system. The curvature mirror has a focal length selected so that the pulse laser beam as the convergent beam from the curvature mirror has a beam spread angle that is constant irrespective of thermal deformation of the propagation mirror or constant with change in a predetermined allowable range irrespective of thermal deformation of the propagation mirror.

An electronic device manufacturing method according to another aspect of the present disclosure includes generating extreme ultraviolet light with an extreme ultraviolet light generation apparatus including a condensation optical system configured to condense a pulse laser beam emitted from a laser apparatus, a propagation mirror disposed on an optical path between the laser apparatus and the condensation optical system and configured to change the propagation direction of the pulse laser beam, and a curvature mirror disposed on an optical path between the propagation mirror and the condensation optical system and having a concave reflective surface configured to convert the pulse laser beam to be incident on the condensation optical system into a convergent beam, the curvature mirror having a focal length selected so that the pulse laser beam as the convergent beam from the curvature mirror has a beam spread angle that is constant irrespective of thermal deformation of the propagation mirror or constant with change in a predetermined allowable range irrespective of thermal deformation of the propagation mirror, by guiding, to the condensation optical system, the pulse laser beam emitted from the laser apparatus and irradiating a target substance with the pulse laser beam through the condensation optical system; outputting the extreme ultraviolet light to an exposure apparatus; and exposing a photosensitive substrate to the extreme ultraviolet light in the exposure apparatus to manufacture an electronic device.

BRIEF DESCRIPTION OF THE DRAWINGS

Embodiments of the present disclosure will be described below as examples with reference to the accompanying drawings.

DESCRIPTION OF EMBODIMENTS

Figure 1:
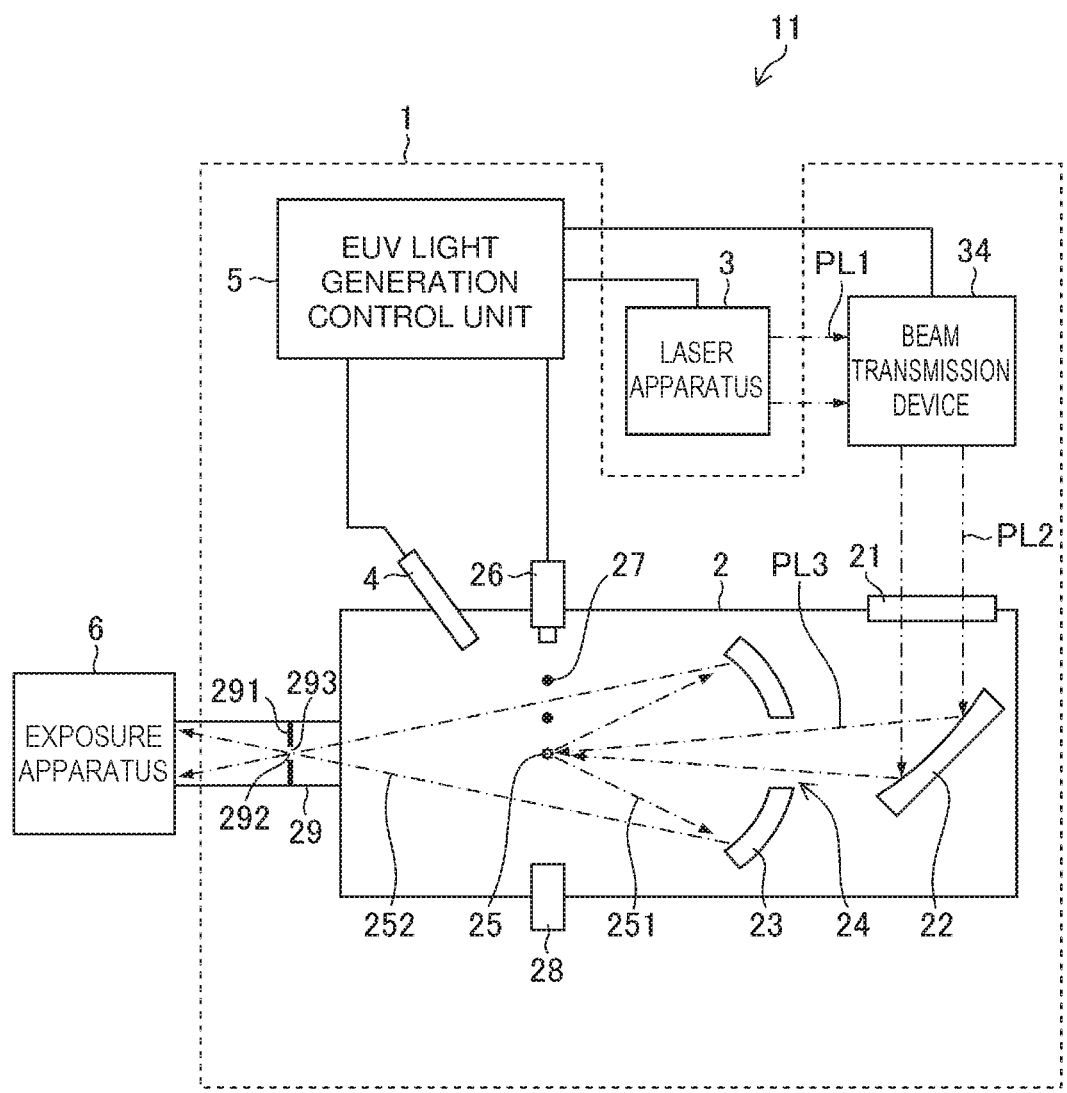
FIG. 1 schematically illustrates the configuration of an exemplary LPP scheme EUV light generation system.

<Contents>
1. Terms
2. Overall description of EUV light generation system
   2.1 Configuration
   2.2 Operation
3. Description of EUV light generation apparatus according to comparative example
   3.1 Configuration
   3.2 Operation
4. Problem
5. Embodiment 1
   5.1 Configuration
   5.2 Exemplary configuration of curvature mirror
   5.3 Operation
   5.4 Description of convergent beam and divergent beam
   5.5 Method of selecting focal length of curvature mirror
      5.5.1 Derivation of conditional expressions
      5.5.2 Specific example
   5.6 Effect
6. Embodiment 2
   6.1 Configuration
   6.2 Exemplary mirror unit equipped with focal length change mechanism
      6.2.1 Specific Example 1
      6.2.2 Specific Example 2
      6.2.3 Specific Example 3
   6.3 Operation
   6.4 Effect
   6.5 Modification
7. Exemplary configuration of laser apparatus
8. Exemplary application as designing support system
9. Exemplary electronic device manufacturing method using EUV light generation apparatus Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Terms

A "target" is an object irradiated with a laser beam introduced into a chamber. When irradiated with the laser beam, the target generates plasma and radiates EUV light. The target is a plasma generation source.

A "droplet" is a form of the target supplied into the chamber. The droplet may mean the target deformed into a droplet form having a substantially spherical shape due to the surface tension of a target substance being melted.

A "plasma generation region" is a region in which plasma is generated in the chamber. The plasma generation region is a region in which the target supplied into the chamber is irradiated with a laser beam and plasma is generated from the target. A position on the target irradiated with the laser beam is referred to as a "target irradiation position".

A "pulse laser beam" may be a laser beam including a plurality of pulses.

A "laser beam" is not limited to a pulse laser beam but may be a general laser beam. The optical path of the laser beam is referred to as a "laser beam path". An "upstream side" on the laser beam path means a side close to a light source of the laser beam on the laser beam path. A "downstream side" means a side far from the light source of the laser beam on the laser beam path.

"Plasma light" is radiation light radiated from the target as plasma. This radiation light includes EUV light.

"EUV light" stands for "extreme ultraviolet light". "EUV light generation apparatus" stands for "extreme ultraviolet light generation apparatus".

2. Overall Description of EUV Light Generation System 2.1 Configuration

FIG. 1 schematically illustrates the configuration of an exemplary LPP scheme EUV light generation system. An EUV light generation apparatus 1 is used together with at least one laser apparatus 3. A system including the EUV light generation apparatus 1 and the laser apparatus 3 is referred to as an EUV light generation system 11 in the following description.

The EUV light generation apparatus 1 includes a chamber 2 and a target supply unit 26. The chamber 2 is a sealable container. The target supply unit 26 supplies the target substance into the chamber 2 and is attached to, for example, penetrate through the wall of the chamber 2. The material of the target substance may contain tin, terbium, gadolinium, lithium, xenon, or combination of any two or more of these materials, but is not limited thereto.

The wall of the chamber 2 is provided with at least one through-hole. The through-hole is blocked by a window 21 through which a pulse laser beam PL2 output from the laser apparatus 3 transmits. For example, an EUV condensing mirror 23 having a spheroidal reflective surface is disposed inside the chamber 2. The EUV condensing mirror 23 has a first focal point and a second focal point. For example, a multi-layer reflective film obtained by alternately stacking molybdenum and silicon is formed on the surface of the EUV condensing mirror 23. The EUV condensing mirror 23 is disposed so that, for example, the first focal point is positioned in a plasma generation region 25 and the second focal point is positioned at an intermediate focus point (IF) 292. The EUV condensing mirror 23 is provided with a through-hole 24 at a central part thereof through which a pulse laser beam PL3 passes.

The EUV light generation apparatus 1 includes a target sensor 4, an EUV light generation control unit 5, and the like. The target sensor 4 detects one or a plurality of the existence, trajectory, position, and speed of a target 27. The target sensor 4 may have an image capturing function.

In addition, the EUV light generation apparatus 1 includes a connection unit 29 that provides communication between the inside of the chamber 2 and the inside of an exposure apparatus 6. The connection unit 29 includes a wall 291 through which an aperture 293 is formed. The wall 291 is disposed so that the aperture 293 is positioned at the second focal point of the EUV condensing mirror 23.

In addition, the EUV light generation apparatus 1 includes a beam transmission device 34, a laser beam condensing mirror 22, a target collection unit 28 configured to collect the target 27, and the like. The beam transmission device 34 includes an optical element for defining the transmission state of a laser beam, and an actuator for adjusting the position, posture, and the like of the optical element. The target collection unit 28 is disposed on an extended line of a direction in which the target 27 output into the chamber 2 proceeds.

2.2 Operation

The following describes the operation of an exemplary LPP scheme EUV light generation system 11 with reference to FIG. 1. The inside of the chamber 2 is maintained at a pressure lower than atmospheric pressure and may be preferably vacuum. Alternatively, gas having high transmittance for EUV light exists inside the chamber 2. The gas inside the chamber 2 may be, for example, hydrogen gas.

A pulse laser beam PL1 output from the laser apparatus 3 passes through the beam transmission device 34, transmits through the window 21 as the pulse laser beam PL2, and is incident in the chamber 2. The pulse laser beam PL2 travels inside the chamber 2 along at least one laser beam path and is reflected by the laser beam condensing mirror 22 and incident on at least one target 27 as the pulse laser beam PL3.

The target supply unit 26 outputs the target 27 formed of the target substance toward the plasma generation region 25 inside the chamber 2. The target supply unit 26 forms droplets by, for example, a continuous jet scheme. In the continuous jet scheme, a nozzle is vibrated to provide periodic vibration to flow of the target substance ejected in a jet form through a nozzle hole, thereby periodically separating the target substance. The separated target substance may form a free interface by the own surface tension, thereby forming a droplet.

The target 27 is irradiated with at least one pulse included in the pulse laser beam PL3. Plasma is generated when the target 27 is irradiated with the pulse laser beam PL3, and radiates radiation light 251. EUV light 252 included in the radiation light 251 is selectively reflected by the EUV condensing mirror 23. The EUV light 252 reflected by the EUV condensing mirror 23 is condensed at the intermediate focus point 292 and output to the exposure apparatus 6. One target 27 may be irradiated with a plurality of pulses included in the pulse laser beam PL3.

The EUV light generation control unit 5 collectively controls the entire EUV light generation system 11. The EUV light generation control unit 5 processes a result of detection by the target sensor 4. The EUV light generation control unit 5 controls the output timing of the target 27, the output direction of the target 27, and the like based on the result of detection by the target sensor 4. In addition, the EUV light generation control unit 5 controls the oscillation timing of the laser apparatus 3, the traveling direction of the pulse laser beam PL2, the focusing position of the pulse laser beam PL3, and the like. The above-described various kinds of control are merely exemplary, and may include other control as necessary.

Figure 2:
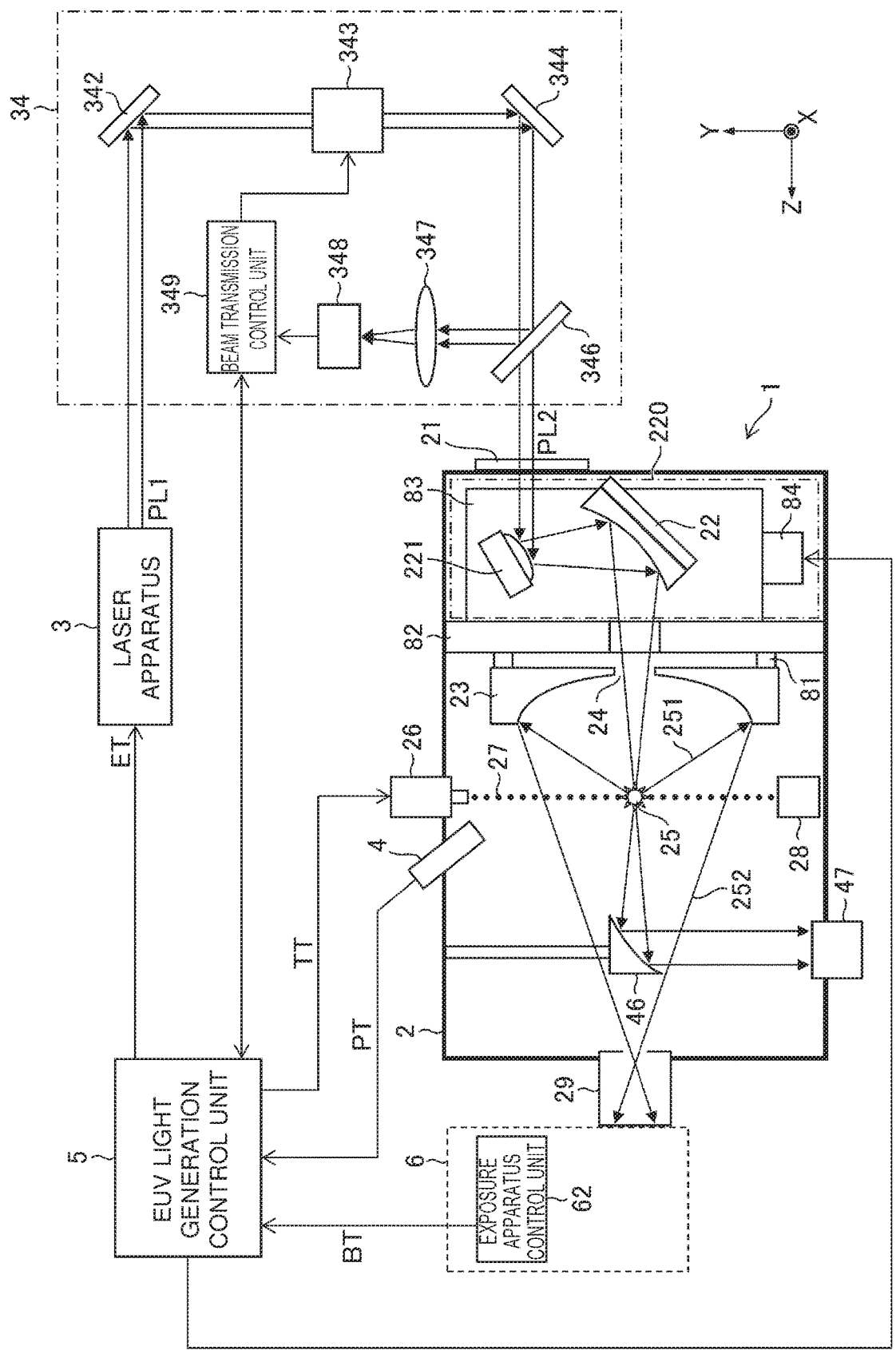
FIG. 2 illustrates details of an exemplary configuration of an EUV light generation apparatus according to a comparative example.

3. Description of EUV Light Generation Apparatus According to Comparative Example 3.1 Configuration FIG. 2 illustrates details of an exemplary configuration of the EUV light generation apparatus 1 according to a comparative example. As illustrated in FIG. 2, the chamber 2 includes a laser beam condensation optical system 220, the EUV condensing mirror 23, the target collection unit 28, an EUV condensing mirror holder 81, a first plate 82, a second plate 83, a laser beam manipulator 84, and a damper mirror 46.

The first plate 82 is fixed to the chamber 2. The EUV condensing mirror 23 is fixed to the first plate 82 through the EUV condensing mirror holder 81. The second plate 83 is fixed to the first plate 82 through the laser beam manipulator 84.

The laser beam condensation optical system 220 is a condensation unit including a convex mirror 221 and the laser beam condensing mirror 22. The laser beam condensation optical system 220 is disposed on the second plate 83. The position and posture of each of the convex mirror 221 and the laser beam condensing mirror 22 are maintained so that the pulse laser beam PL3 reflected by the convex mirror 221 and the laser beam condensing mirror 22 is condensed in the plasma generation region 25.

The laser beam manipulator 84 moves the laser beam condensation optical system 220 on the second plate 83 relative to the first plate 82. The laser beam manipulator 84 can move the focusing position of the pulse laser beam PL3 to a position specified by the EUV light generation control unit 5 in directions along an X axis, a Y axis, and a Z axis by moving the laser beam condensation optical system 220.

In FIG. 2, the Z axis is defined to be an axis passing through the plasma generation region 25 and the intermediate focus point 292. The Z axial direction is the direction in which the EUV light 252 is output from the chamber 2 to the exposure apparatus 6. In addition, the Y axis is defined to be an axis passing through the nozzle hole of the target supply unit 26 and the plasma generation region 25. The Y axial direction is the direction in which the target supply unit 26 outputs the target 27 toward the plasma generation region 25. The X axis is defined to be an axis orthogonal to the Y axis and the Z axis. In FIG. 2, the X axial direction is orthogonal to the sheet.

The damper mirror 46 is disposed on the laser beam path downstream of the plasma generation region 25 and reflects a pulse laser beam having passed through the plasma generation region 25 toward a beam dump device 47. The damper mirror 46 may reflect an incident pulse laser beam through conversion into parallel light and may be an off-axis parabolic mirror. The damper mirror 46 may include a heater configured to heat a reflective surface thereof to a temperature equal to or higher than the melting point of the target substance.

The beam dump device 47 is disposed where the pulse laser beam reflected by the damper mirror 46 is incident. The beam dump device 47 is attached to the chamber 2. The beam dump device 47 includes a damper window on which the pulse laser beam reflected by the damper mirror 46 is incident.

The target supply unit 26 may store inside a target material in a melted state. The nozzle hole formed at the target supply unit 26 may be positioned inside the chamber 2. The target supply unit 26 may supply the melted target material as the target 27 in a droplet form to the plasma generation region 25 in the chamber 2 through the nozzle hole.

The beam transmission device 34 and the EUV light generation control unit 5 are provided outside the chamber 2. The beam transmission device 34 guides, to the laser beam condensation optical system 220 through the window 21, a pulse laser beam output from the laser apparatus 3.

The beam transmission device 34 includes a propagation mirror 342, a beam adjuster 343, a propagation mirror 344, a beam sampler 346, a sample light condensation optical system 347, a beam monitor 348, and a beam transmission control unit 349. The propagation mirror 342, the beam adjuster 343, the propagation mirror 344, the beam sampler 346, the window 21, the convex mirror 221, and the laser beam condensing mirror 22 are disposed in the stated order on the laser beam path. The propagation mirrors 342 and 344 may be high reflectance mirrors configured to change the propagation direction of the pulse laser beam.

Several tens of propagation mirrors (not illustrated) may be disposed between the laser apparatus 3 and the propagation mirror 342. In addition, several propagation mirrors (not illustrated) may be disposed between the propagation mirror 344 and the laser beam condensing mirror 22.

The laser apparatus 3 may include an oscillator and a plurality of amplifiers (not illustrated). In addition, a propagation mirror (not illustrated) may be disposed between the oscillator and the set of amplifiers and/or between the amplifiers.

The beam adjuster 343 adjusts the divergence angle of an input pulse laser beam and outputs the pulse laser beam.

The beam sampler 346 is disposed between the propagation mirror 344 and the laser beam condensing mirror 22 to bifurcate the pulse laser beam. The beam sampler 346 may be a beam splitter.

The beam sampler 346 introduces part of the pulse laser beam to the sample light condensation optical system 347 as sample light. The sample light condensation optical system 347 condenses the sample light and is disposed on the optical path of the sample light. The sample light condensation optical system 347 obtains a condensation image substantially equivalent to that obtained by the laser beam condensation optical system 220.

The beam monitor 348 is disposed so that a light receiving surface thereof is positioned near the focal point of the sample light condensation optical system 347. The beam monitor 348 may be, for example, a beam profiler.

The beam transmission control unit 349 is connected with the beam adjuster 343 and the beam monitor 348. In addition, the beam transmission control unit 349 is connected with the EUV light generation control unit 5.

The EUV light generation control unit 5 receives a control signal from an exposure apparatus control unit 62 of the exposure apparatus 6. The EUV light generation control unit 5 controls the target supply unit 26, the laser apparatus 3, the beam transmission control unit 349, and the laser beam manipulator 84 in accordance with the control signal from the exposure apparatus 6.

Control devices such as the EUV light generation control unit 5, the exposure apparatus control unit 62, and the beam transmission control unit 349 may be each achieved by hardware and software combination of one or a plurality of computers. The software is synonymous with a computer program. A computer conceptually includes a programmable controller and a sequencer.

A computer includes, for example, a central processing unit (CPU) and a memory. The CPU is an exemplary processor. Some or all processing functions of various control devices such as the EUV light generation control unit 5, the exposure apparatus control unit 62, and the beam transmission control unit 349 may be achieved by using an integrated circuit such as a field programmable gate array (FPGA) or an application specific integrated circuit (ASIC).

Functions of a plurality of control devices can be achieved by a single control device. In addition, in the present disclosure, the EUV light generation control unit 5, the exposure apparatus control unit 62, the beam transmission control unit 349, and the like may be connected with each other through a communication network such as a local area network or the Internet. In a distributed computing environment, a computer program unit may be stored in local and remote memory storage devices.

3.2 Operation

The EUV light generation control unit 5 transmits a target output signal TT to the target supply unit 26. The target supply unit 26 may supply the target 27 in a droplet form to the plasma generation region 25 at a predetermined speed and a predetermined interval in accordance with the target output signal TT from the EUV light generation control unit 5. For example, the target supply unit 26 generates droplets at a predetermined frequency of several tens kHz to several hundreds kHz.

The target sensor 4 detects a droplet passing through a predetermined region. The target sensor 4 outputs, as a detection signal for the target 27, a pass timing signal PT indicating the pass timing of the droplet to the EUV light generation control unit 5.

The EUV light generation control unit 5 receives a burst signal BT from the exposure apparatus control unit 62. The burst signal BT instructs the EUV light generation system 11 to generate EUV light in a predetermined duration. The EUV light generation control unit 5 performs control for outputting EUV light to the exposure apparatus 6 in the predetermined duration.

In a duration in which the burst signal BT is on, the EUV light generation control unit 5 controls the laser apparatus 3 to output a pulse laser beam in accordance with the pass timing signal PT. In a duration in which the burst signal BT is off, the EUV light generation control unit 5 controls the laser apparatus 3 to stop outputting a pulse laser beam.

For example, the EUV light generation control unit 5 outputs the burst signal BT received from the exposure apparatus control unit 62 and a light emission trigger signal ET delayed from the pass timing signal PT by a predetermined time to the laser apparatus 3. In the duration in which the burst signal BT is on, the laser apparatus 3 outputs a pulse laser beam in response to each pulse of the light emission trigger signal ET.

The EUV light generation control unit 5 may control the laser beam manipulator 84 to adjust the irradiation position of a pulse laser beam. The EUV light generation control unit 5 may change the delay time between the pass timing signal PT and the light emission trigger signal ET.

EUV light is generated when the target 27 having arrived at the plasma generation region 25 is irradiated with a pulse laser beam condensed through the laser beam condensation optical system 220. The pulse laser beam with which the target 27 is not irradiated can be incident on the damper mirror 46.

The pulse laser beam reflected by the damper mirror 46 is absorbed by the beam dump device 47 and converted into heat. The heat generated in this case is discharged to the outside by a cooling device (not illustrated).

The laser apparatus 3 may be disposed on a floor different from that on which the chamber 2 is disposed. In this case, the beam transmission device 34 transmits a laser beam through an optical path formed at the length of several tens meters. Thus, the beam transmission device 34 transmits a pulse laser beam while adjusting, through the beam adjuster 343, the divergence angle of the pulse laser beam being transmitted. The beam transmission device 34 may include one or more beam adjusters (not illustrated) in place of or in addition to the beam adjuster 343.

The beam sampler 346 guides part of a pulse laser beam incident on the laser beam condensation optical system 220 to the sample light condensation optical system 347 as the sample light. The beam monitor 348 transmits a signal representing a condensation image of the sample light to the beam transmission control unit 349.

The beam transmission control unit 349 controls the beam adjuster 343 based on the condensation image of the sample light so that the divergence angle of a pulse laser beam incident on the laser beam condensation optical system 220 is appropriate. Specifically, the beam transmission control unit 349 adjusts the beam size of a pulse laser beam incident on the target 27 by controlling the beam adjuster 343 based on a result of measurement by the beam monitor 348. The efficiency of conversion into EUV light can be maintained by maintaining the beam size of a pulse laser beam incident on the target 27.

4. Problem

Figure 3:
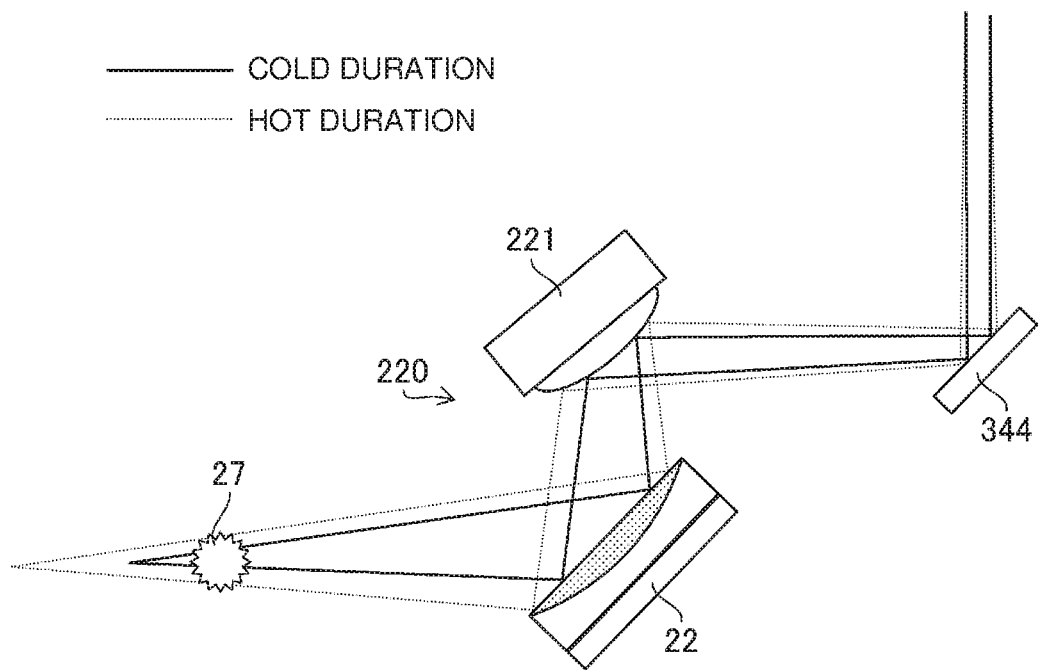
FIG. 3 illustrates an exemplary effect of pulse laser beam condensation through a laser beam condensation optical system.

FIG. 3 illustrates an exemplary effect of pulse laser beam condensation through the laser beam condensation optical system 220. The pulse laser beam is a divergent beam, and thus the beam spread angle thereof increases when, for example, the propagation mirror (not illustrated) in the laser apparatus 3, and the propagation mirrors 342 and 344 and the like disposed on the optical path of the pulse laser beam after emission from the laser apparatus 3 are deformed into convex surfaces by heat.

In the following description, the duration in which the temperatures of optical elements such as the propagation mirrors 342 and 344 and the laser beam condensing mirror 22 are at room temperature is referred to as "cold duration". The cold duration is the duration of a state in which thermal deformation of a mirror or the like does not occur. The description "does not occur" includes a state in which the thermal deformation does not occur or a state in which the thermal deformation is sufficiently small and is negligible. The duration in which the temperatures of the propagation mirrors 342 and 344, the laser beam condensing mirror 22, and the like have increased through pulse laser beam irradiation and the thermal deformation is stationary is referred to as "hot duration".

In FIG. 3, a light beam illustrated with solid lines indicates a beam path in the cold duration, and a light beam illustrated with dotted lines indicates a beam path in the hot duration. As illustrated in FIG. 3, in the hot duration, the beam spread angle increases due to the mirror thermal deformation and the beam size of the pulse laser beam reflected by the laser beam condensing mirror 22 at the target irradiation position increases, and as a result, the efficiency of conversion into EUV light decreases. Thus, in the EUV light generation apparatus 1 according to the comparative example, the beam transmission control unit 349 controls the beam adjuster 343 based on a result of measurement by the beam monitor 348, thereby adjusting the beam spread angle.

5. Embodiment 1

5.1 Configuration

Figure 4:
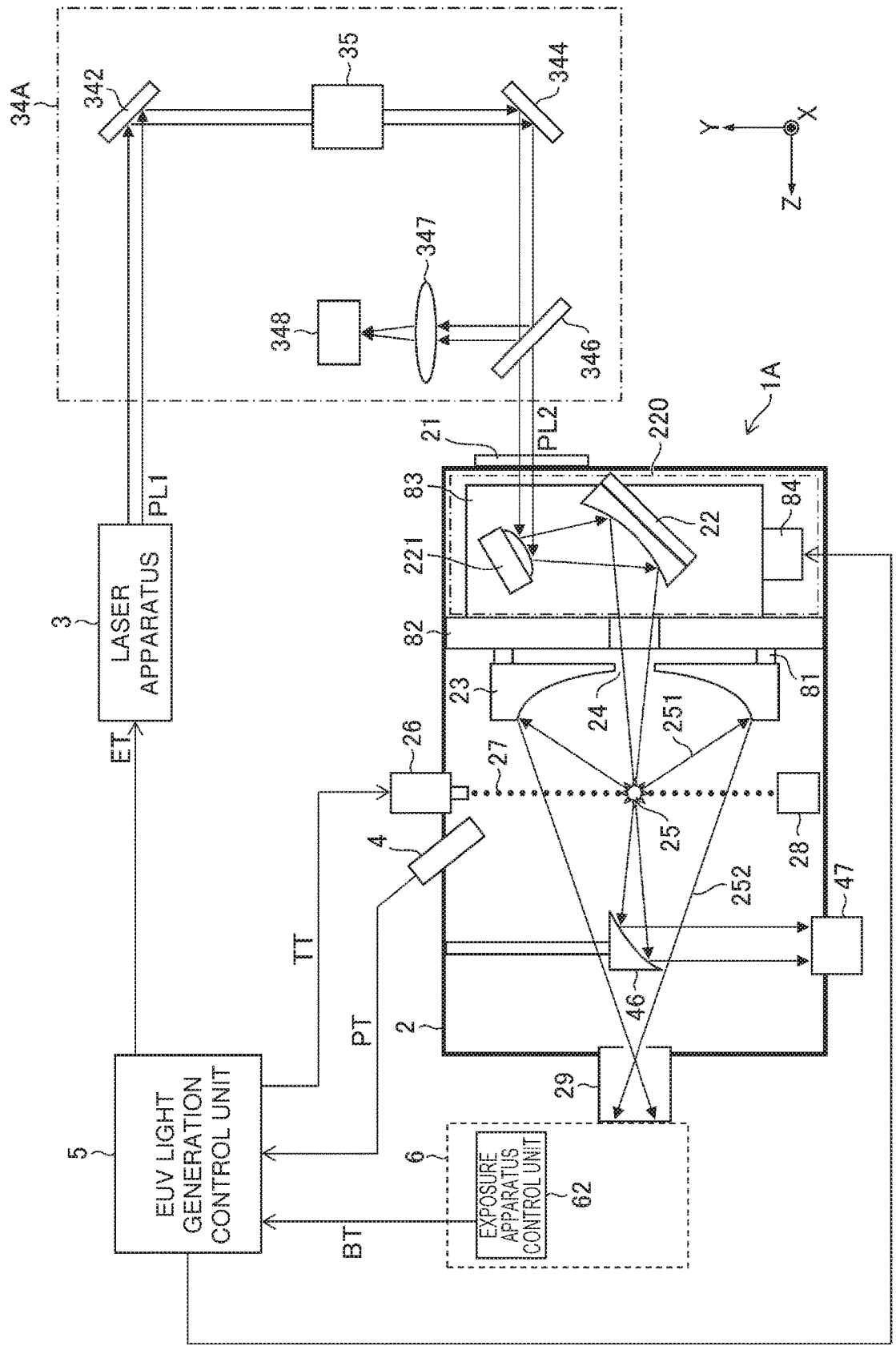
FIG. 4 schematically illustrates the configuration of the EUV light generation apparatus according to Embodiment 1.

FIG. 4 schematically illustrates the configuration of an EUV light generation apparatus 1A according to Embodiment 1. In the EUV light generation apparatus 1A according to Embodiment 1, a configuration same as that of the EUV light generation apparatus 1 of the comparative example will not be described, but any difference therebetween will be described below.

As illustrated in FIG. 4, the EUV light generation apparatus 1A includes a beam transmission device 34A in place of the beam transmission device 34 in FIG. 2. Comparison with the beam transmission device 34 in FIG. 2 indicates that the beam transmission device 34A includes a curvature mirror 35 having a concave reflective surface in place of the beam adjuster 343, and thus the beam transmission control unit 349 is unnecessary. The curvature mirror 35 may be a mirror unit as combination of a plurality of mirrors. The beam transmission device 34A is an exemplary "beam delivery system" in the present disclosure.

5.2 Exemplary Configuration of Curvature Mirror

Figure 5:
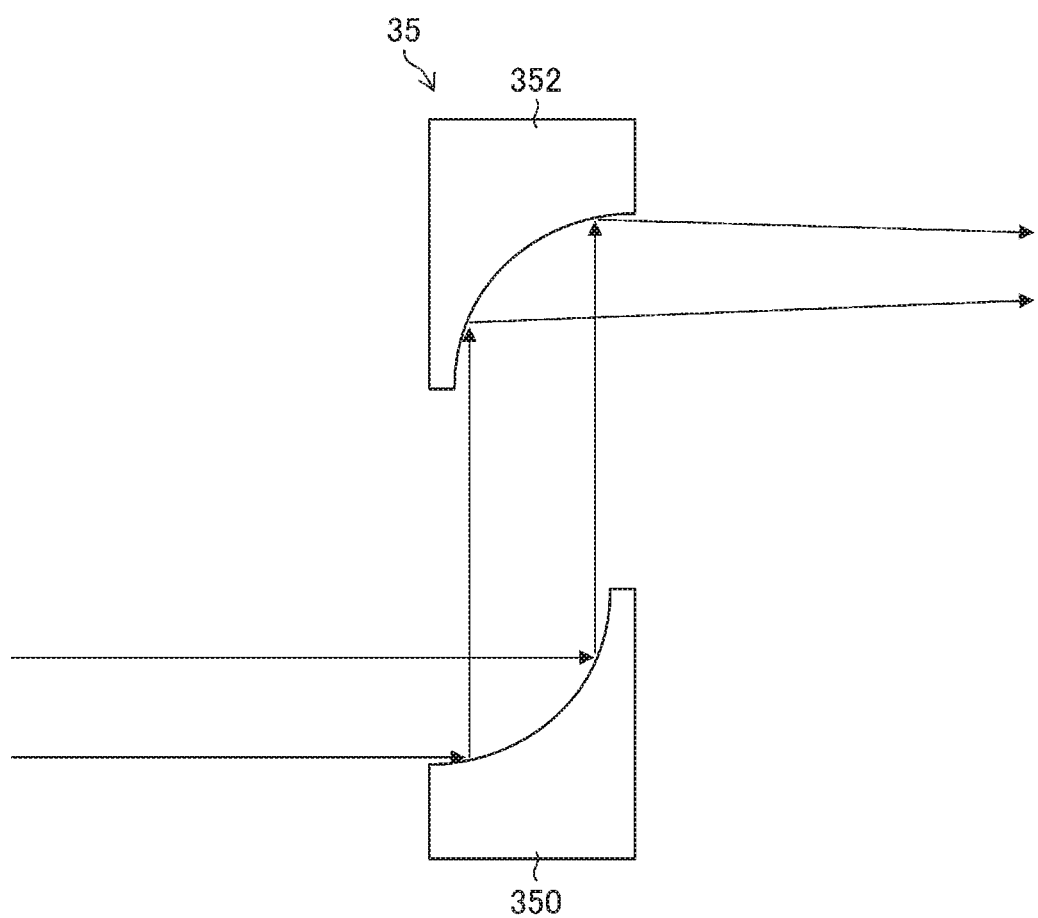
FIG. 5 illustrates Exemplary Configuration 1 of a curvature mirror.

FIG. 5 illustrates Exemplary Configuration 1 of the curvature mirror 35. For example, the curvature mirror 35 is configured by combination of a first off-axis parabolic concave mirror 350 and a second off-axis parabolic concave mirror 352 as illustrated in FIG. 5. A laser beam reflected by the first off-axis parabolic concave mirror 350 is incident on the second off-axis parabolic concave mirror 352 and reflected by the second off-axis parabolic concave mirror 352. A pulse laser beam from the second off-axis parabolic concave mirror 352 is a convergent beam.

The combination of the first off-axis parabolic concave mirror 350 and the second off-axis parabolic concave mirror 352 is an exemplary "mirror unit constituted by combining a plurality of concave mirrors" in the present disclosure.

Figure 6:
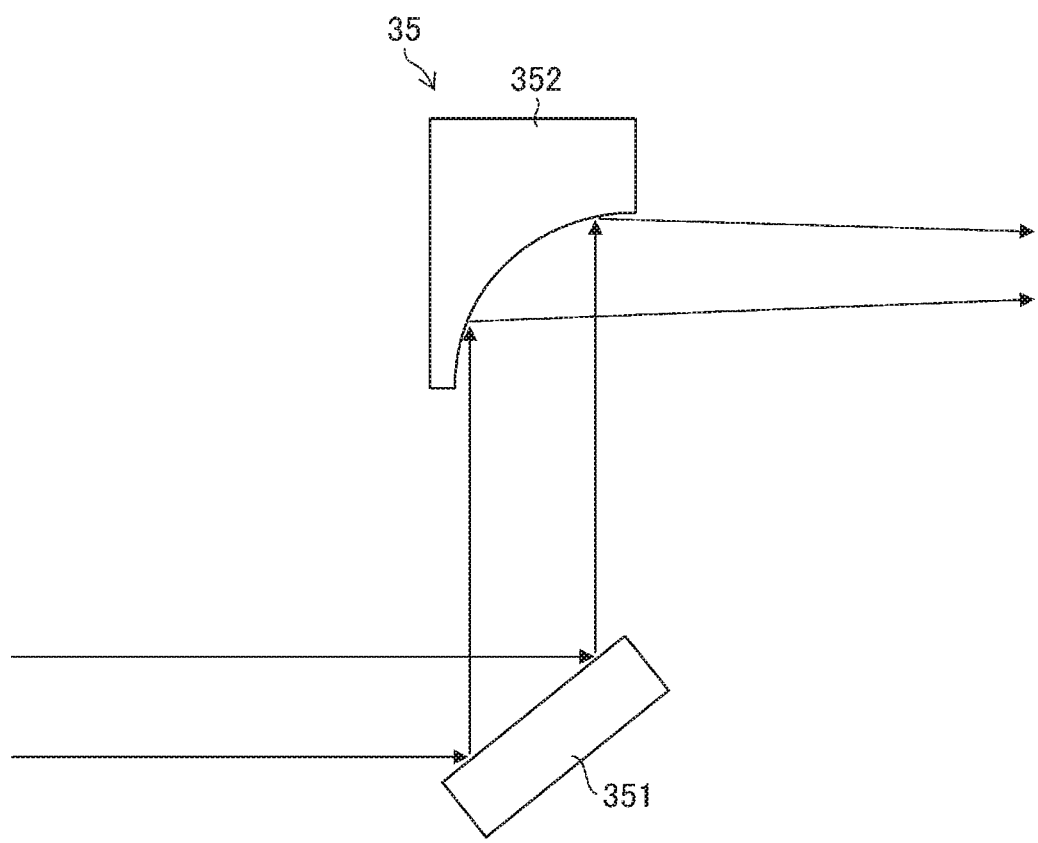
FIG. 6 illustrates Exemplary Configuration 2 of the curvature mirror.

FIG. 6 illustrates Exemplary Configuration 2 of the curvature mirror 35. As illustrated in FIG. 6, a planar mirror 351 may be employed in place of the first off-axis parabolic concave mirror 350 described with reference to FIG. 5. In other words, the curvature mirror 35 may be configured by combination of the planar mirror 351 and the second off-axis parabolic concave mirror 352. The combination of the planar mirror 351 and the second off-axis parabolic concave mirror 352 is an exemplary "mirror unit constituted by combining a planar mirror and a concave mirror" in the present disclosure.

Figure 7:
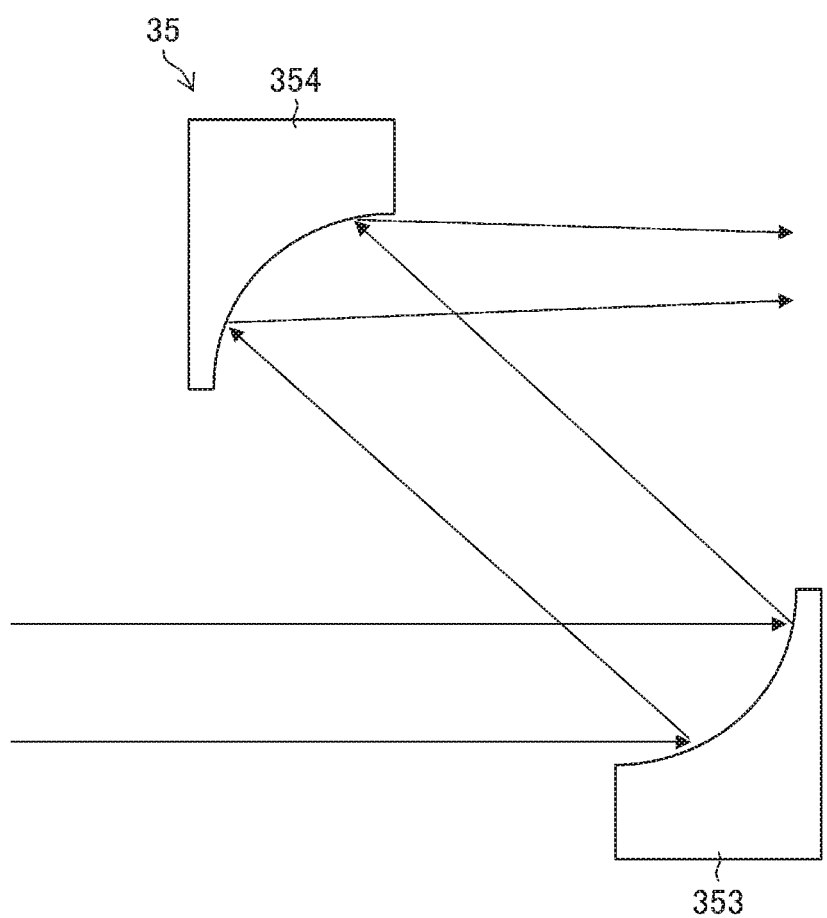
FIG. 7 illustrates Exemplary Configuration 3 of the curvature mirror.

FIG. 7 illustrates Exemplary Configuration 3 of the curvature mirror 35. For example, the curvature mirror 35 may be configured by combination of a first spherical surface concave mirror 353 and a second spherical surface concave mirror 354 as illustrated in FIG. 7. A laser beam reflected by the first spherical surface concave mirror 353 is incident on the second spherical surface concave mirror 354 and reflected by the second spherical surface concave mirror 354. A pulse laser beam from the second spherical surface concave mirror 354 is a convergent beam.

The combination of the first spherical surface concave mirror 353 and the second spherical surface concave mirror 354 is an exemplary "mirror unit constituted by combining a plurality of concave mirrors" in the present disclosure.

Figure 8:
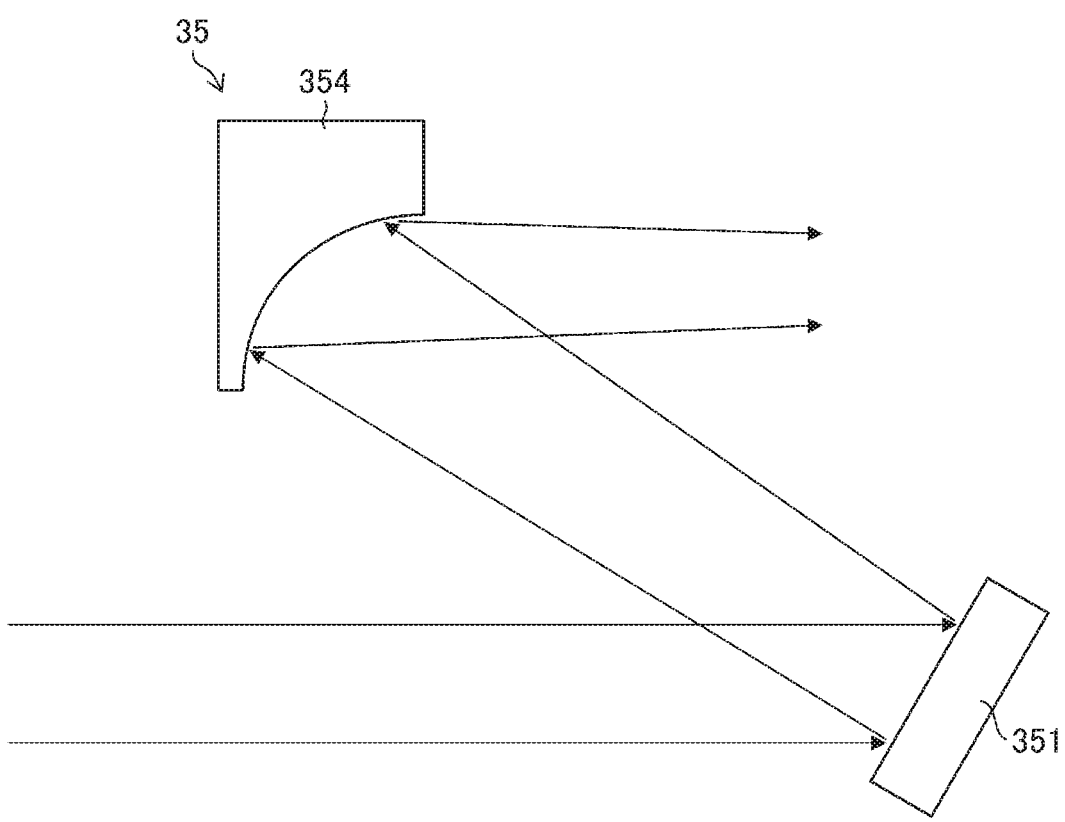
FIG. 8 illustrates Exemplary Configuration 4 of the curvature mirror.

FIG. 8 illustrates Exemplary Configuration 4 of the curvature mirror 35. As illustrated in FIG. 8, the planar mirror 351 may be employed in place of the first spherical surface concave mirror 353 described with reference to FIG. 7. In other words, the curvature mirror 35 may be configured by combination of the planar mirror 351 and the second spherical surface concave mirror 354. The combination of the planar mirror 351 and the second spherical surface concave mirror 354 is an exemplary "mirror unit constituted by combining a planar mirror and a concave mirror" in the present disclosure.

5.3 Operation

Figure 9:
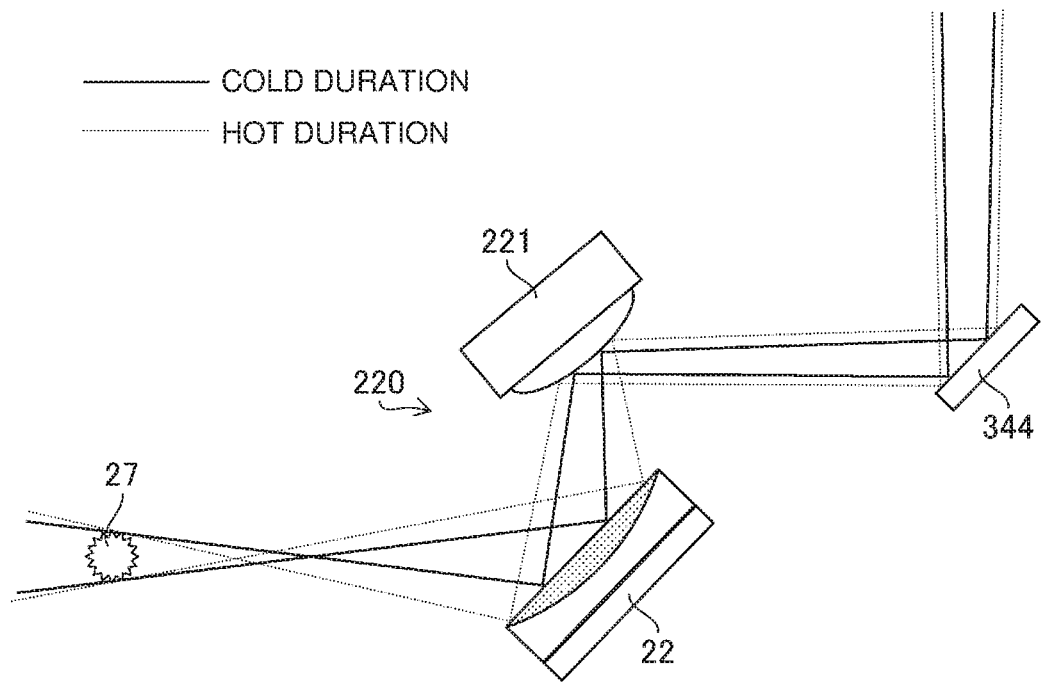
FIG. 9 illustrates an exemplary effect of condensation through the laser beam condensation optical system in the EUV light generation apparatus according to Embodiment 1.

FIG. 9 illustrates an exemplary effect of condensation through the laser beam condensation optical system 220 in the EUV light generation apparatus 1A according to Embodiment 1. The EUV light generation apparatus 1A converts a pulse laser beam into a convergent beam through the curvature mirror 35. The pulse laser beam as the convergent beam from the curvature mirror 35 is reflected by the propagation mirror 344 and incident on the convex mirror 221 of the laser beam condensation optical system 220. Since the pulse laser beam incident on the laser beam condensation optical system 220 is a convergent beam, the focal point of the pulse laser beam through the laser beam condensation optical system 220 is on the near side of the target irradiation position as illustrated in FIG. 9.

In FIG. 9, a light beam illustrated with solid lines indicates a beam path in the cold duration, and a light beam illustrated with dotted lines indicates a beam path in the hot duration. The focal length of the curvature mirror 35 is selected so that the beam size of the pulse laser beam incident on the target 27 does not change even when the beam spread angle of a pulse laser beam emitted from the laser apparatus 3 has increased due to thermal deformation of the propagation mirrors 342 and 344 and the like. The description "the beam size does not change" is not limited to a case in which the beam size is unchanged, but includes a case in which the beam size substantially does not change with change in an allowable range with which the beam size can be regarded as unchanged in effect.

5.4 Description of Convergent Beam and Divergent Beam

Figure 10:
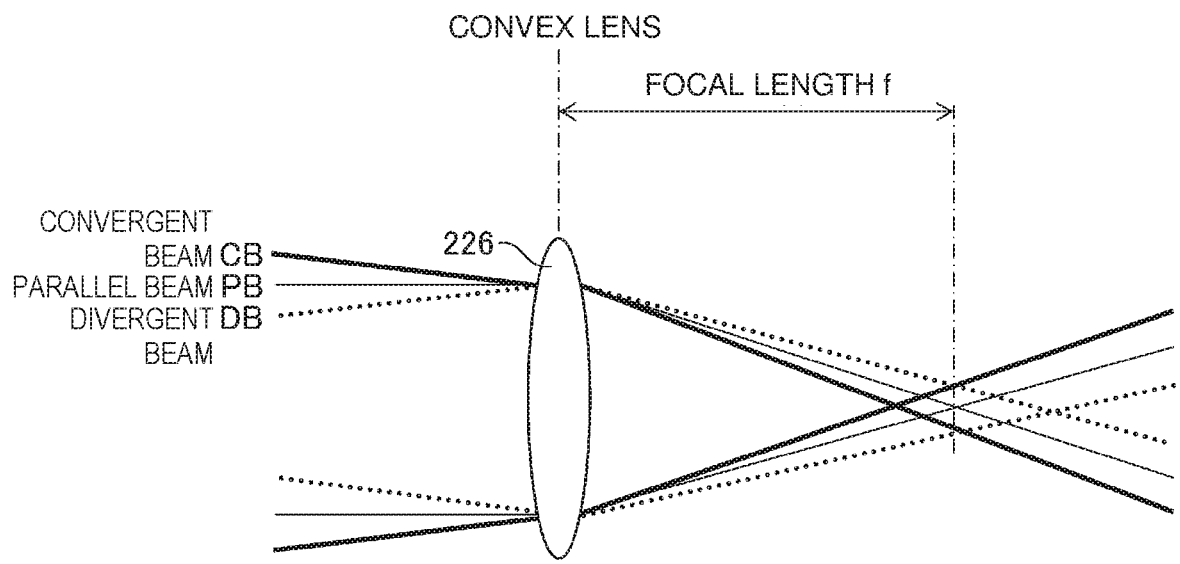
FIG. 10 is an explanatory diagram illustrating an exemplary beam path when a convergent beam and a divergent beam are each incident on a condensation optical system.

FIG. 10 is an explanatory diagram illustrating exemplary beam paths when a convergent beam and a divergent beam are incident on a condensation optical system. For simplification of illustration, description of a convex lens 226 as a transmissive condensation optical system is made in place of description of a reflective condensation optical system. FIG. 10 illustrates the effect of condensation through the convex lens 226 when a parallel beam PB, a convergent beam CB, and a divergent beam DB are incident on the convex lens 226.

When incident on the convex lens 226, the parallel beam PB has a focal point at the position separated from the position of the convex lens 226 by a focal length f. When incident on the convex lens 226, the convergent beam CB has a focal point at a position nearer to the position of the convex lens 226 than the focal length f. When incident on the convex lens 226, the divergent beam DB has a focal point at a position farther from the position of the convex lens 226 than the focal length f.

In Embodiment 1, a pulse laser beam is converted into a convergent beam through the curvature mirror 35, and the convergent beam is incident on the laser beam condensation optical system 220. Accordingly, a pulse laser beam from the laser beam condensation optical system 220 has a focal point at a position on the near side of the position of the focal length of the laser beam condensation optical system 220. Specifically, a minimum spot position at which a spot diameter is smallest is on the near side of the irradiation position of the target 27, and at the target irradiation position, the target 27 is irradiated with the pulse laser beam as a defocused beam diffusing in a spreading direction.

Figure 11:
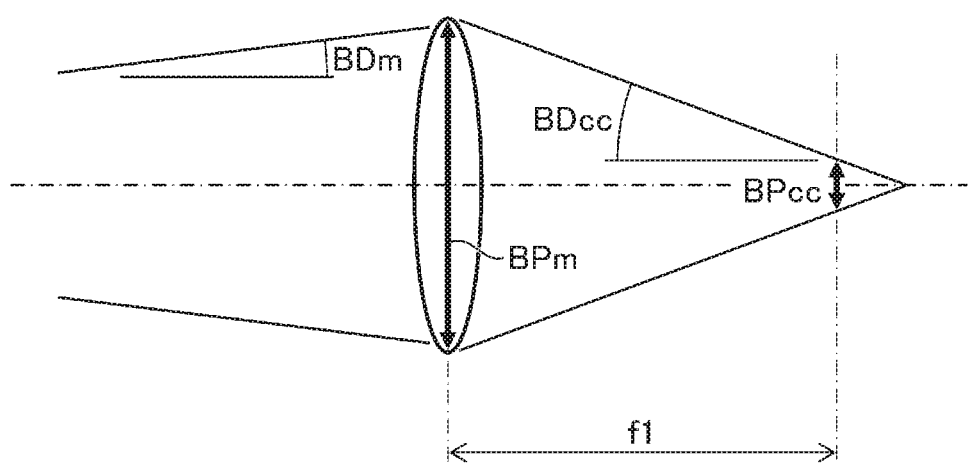
FIG. 11 is an explanatory diagram illustrating an optical effect of the curvature mirror through illustration of a convex lens.

5.5 Method of Selecting Focal Length of Curvature Mirror 5.5.1 Derivation of Conditional Expressions FIG. 11 is an explanatory diagram illustrating an optical effect of the curvature mirror 35 through illustration of a convex lens. In FIG. 11, f1 represents the focal length of the curvature mirror 35, BPm represents the beam size of a pulse laser beam emitted from the laser apparatus 3 at the position of the curvature mirror 35, BDm represents the beam spread angle of the pulse laser beam incident at the position of the curvature mirror 35 in the cold duration, BDcc represents the beam spread angle of the pulse laser beam from the curvature mirror 35 in the cold duration, and BPcc represents the beam size at a position separated from the curvature mirror 35 by f1 in the cold duration. The beam spread angle is defined to be positive when the pulse laser beam is a divergent beam, or negative when the pulse laser beam is a convergent beam.

Figure 12:
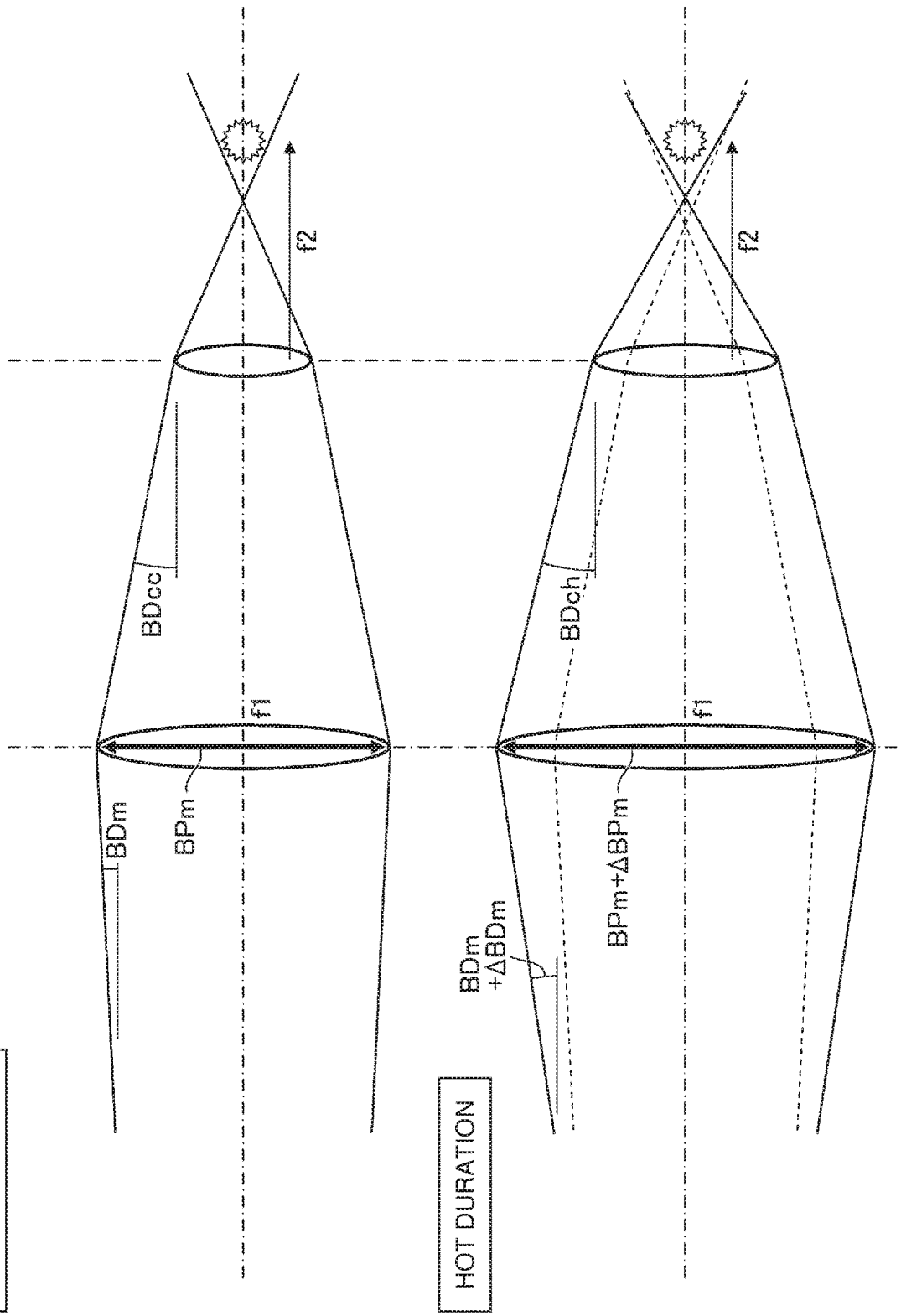
FIG. 12 schematically illustrates beam paths in a cold duration and a hot duration.

FIG. 12 schematically illustrates beam paths in the cold duration and the hot duration. In FIG. 12, the beam path in the cold duration is illustrated at an upper part, and the beam path in the hot duration is illustrated at a lower part. Similarly to FIG. 11, FIG. 12 illustrates optical effects of the curvature mirror 35 and the laser beam condensation optical system 220 through illustration of a convex lens.

The beam size BPcc at a position separated from the curvature mirror 35 by the focal length f1 in the cold duration is expressed by two expressions below. The beam spread angle BDm is positive since a pulse laser beam incident on the curvature mirror 35 is a divergent beam, and the beam spread angle BDcc is negative since a pulse laser beam from the curvature mirror 35 is a convergent beam.

$$BPcc = 2 \cdot f1 \cdot BDm \quad (1)$$

$$BPcc = BPm + 2 \cdot f1 \cdot BDcc \quad (2)$$

An expression below can be obtained from Expressions (1) and (2).

$$BDcc = (-BPm + 2 \cdot f1 \cdot BDm)/(2 \cdot f1) \quad (3)$$

The beam size at the target irradiation position is expressed by Expression (4) below:

$$BDcc \cdot f2 \quad (4)$$

where f2 represents the focal length of the laser beam condensation optical system 220. In Embodiment 1, f2 represents the focal length of a mirror unit constituted by combining the convex mirror 221 and the laser beam condensing mirror 22.

Heat influence on f2 is small, and thus the beam size at the target irradiation position can be maintained constant at a desired size unless BDcc changes.

A beam spread angle BDch of a pulse laser beam from the curvature mirror in the hot duration is expressed by Expression (5) below, where ΔBPm represents the amount of change in BPm between the cold duration and the hot duration and ΔBDm represents the amount of change in BDm between the cold duration and the hot duration. Heat influence on x1, f1, and BPm is small and thus it is assumed that these values do not change.

$$BDch = \{-(BPm + \Delta BPm) + 2 \cdot f1 \cdot (BDm + \Delta BDm)\}/(2 \cdot f1) \quad (5)$$

A condition that the beam spread angle of a pulse laser beam from the curvature mirror 35 does not change between the cold duration and the hot duration is expressed by Expression (6).

$$BDch = BDcc \quad (6)$$

Expression (7) below can be obtained by substituting Expressions (3) and (5) into Expression (6) and rearranging the terms.

$$f1 = \Delta BPm/2 \cdot \Delta BDm \quad (7)$$

In Expression (7), calculated values obtained through simulation or the like or measured values based on actual measurement may be used as ΔBPm and ΔBDm to select f1.

When the focal length f1 of the curvature mirror 35 is selected so that the relation of Expression (7) is satisfied, the beam spread angle of a pulse laser beam from the curvature mirror 35 to the laser beam condensation optical system 220 is constant between the cold duration and the hot duration. Then, the beam size at the target irradiation position can be maintained constant at a desired size irrespective of thermal deformation of the propagation mirrors 342 and 344 and the like.

Light from the curvature mirror 35 is narrowed as the incident position of light is farther away from the center of the mirror. Thus, when the beam spread angle and the beam size increase in the hot duration, the beam spread angle of a pulse laser beam from the curvature mirror 35 can be made equal to that in the cold duration.

The beam size at the target irradiation position can be changed by changing the distance from a laser emission port of the laser apparatus 3 to the curvature mirror 35. Through this distance change, BPm and ΔBPm change, and f1 changes based on Expression (7). Accordingly, BDcc changes based on Expression (3). As a result, the beam size at the target irradiation position is changed.

Although Expression (6) expresses the condition that the spread angle of a pulse laser beam from the curvature mirror 35 is equal between the cold duration and the hot duration, the present invention is not limited to a condition that the spread angle is precisely equal therebetween, but may allow a difference between BDch and BDcc in a predetermined allowable range in which BDch and BDcc can be regarded to be equal to each other in effect. Specifically, the focal length f1 of the curvature mirror 35 may be set so that the spread angle of a pulse laser beam from the curvature mirror 35 is maintained constant with change in the predetermined allowable range in which the spread angle can be regarded to be constant in effect between the cold duration and the hot duration. For example, the predetermined allowable range may be −10% to 10% inclusive.

As a condition that the spread angle of a pulse laser beam from the curvature mirror does not change in effect between the cold duration and the hot duration, Expression (8) below may be satisfied in place of Expression (6).

$$0.9 \cdot BDcc < BDch < 1.1 \cdot BDcc \quad (8)$$

When the focal length f1 of the curvature mirror 35 is selected so that Expression (8) is satisfied, the beam spread angle of a pulse laser beam from the curvature mirror 35 to the laser beam condensation optical system 220 is substantially constant between the cold duration and the hot duration with change in the allowable range of ±10%. Accordingly, the beam size at the target irradiation position is maintained substantially constant irrespective of thermal deformation of the propagation mirrors 342 and 344 and the like.

The predetermined allowable range is not limited to the range of −10% to 10% inclusive but may be a narrower allowable range such as the range of −5% to 5% inclusive. A desired allowable range may be set in accordance with the allowable change amount of a beam size requested at the target irradiation position.

The method of selecting the focal length f1 of the curvature mirror 35 so that Expression (7) or (8) is satisfied is an exemplary "focal length selecting method" in the present disclosure. The cold duration is an exemplary "first state duration" in the present disclosure. The hot duration is an exemplary "second state duration" in the present disclosure. The laser beam condensation optical system 220 is an exemplary "condensation optical system" in the present disclosure.

5.5.2 Specific Example

Figure 13:
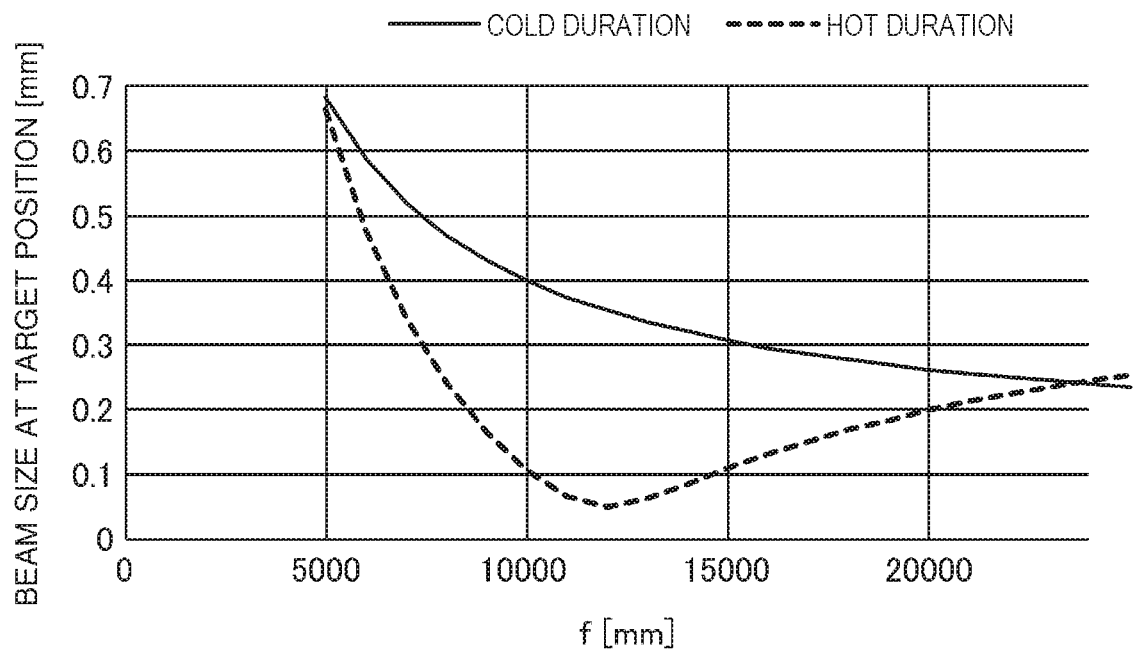
FIG. 13 is a graph illustrating a specific example in which the focal length of the curvature mirror disposed halfway through a beam propagation optical path is selected.

FIG. 13 is a graph illustrating a specific example in which the focal length of the curvature mirror 35 disposed halfway through a beam propagation optical path is selected. The horizontal axis represents the focal length of the curvature mirror 35, and the vertical axis represents the beam size at a target position (irradiation position). In FIG. 13, a graph illustrated with a solid line indicates the beam size in the cold duration, and a graph illustrated with a dashed line indicates the beam size in the hot duration. Based on the graphs as illustrated in FIG. 13, the focal length of the curvature mirror 35 is selected to be 5 m (5000 mm) so that, for example, the beam size at the target irradiation position is substantially 650 μm (0.65 mm) in the cold duration and the hot duration.

5.6 Effect

With the configuration described in Embodiment 1, it is possible to reduce variation in the beam size at the target irradiation position due to thermal deformation of the propagation mirrors 342 and 344 and the like by selecting the focal length of the curvature mirror 35 without controlling the beam adjuster 343. As a result, the efficiency of conversion into EUV light is stabilized. In addition, according to Embodiment 1, the beam adjuster 343 and the beam transmission control unit 349 for controlling the beam adjuster 343 are unnecessary.

6. Embodiment 2

6.1 Configuration

Figure 14:
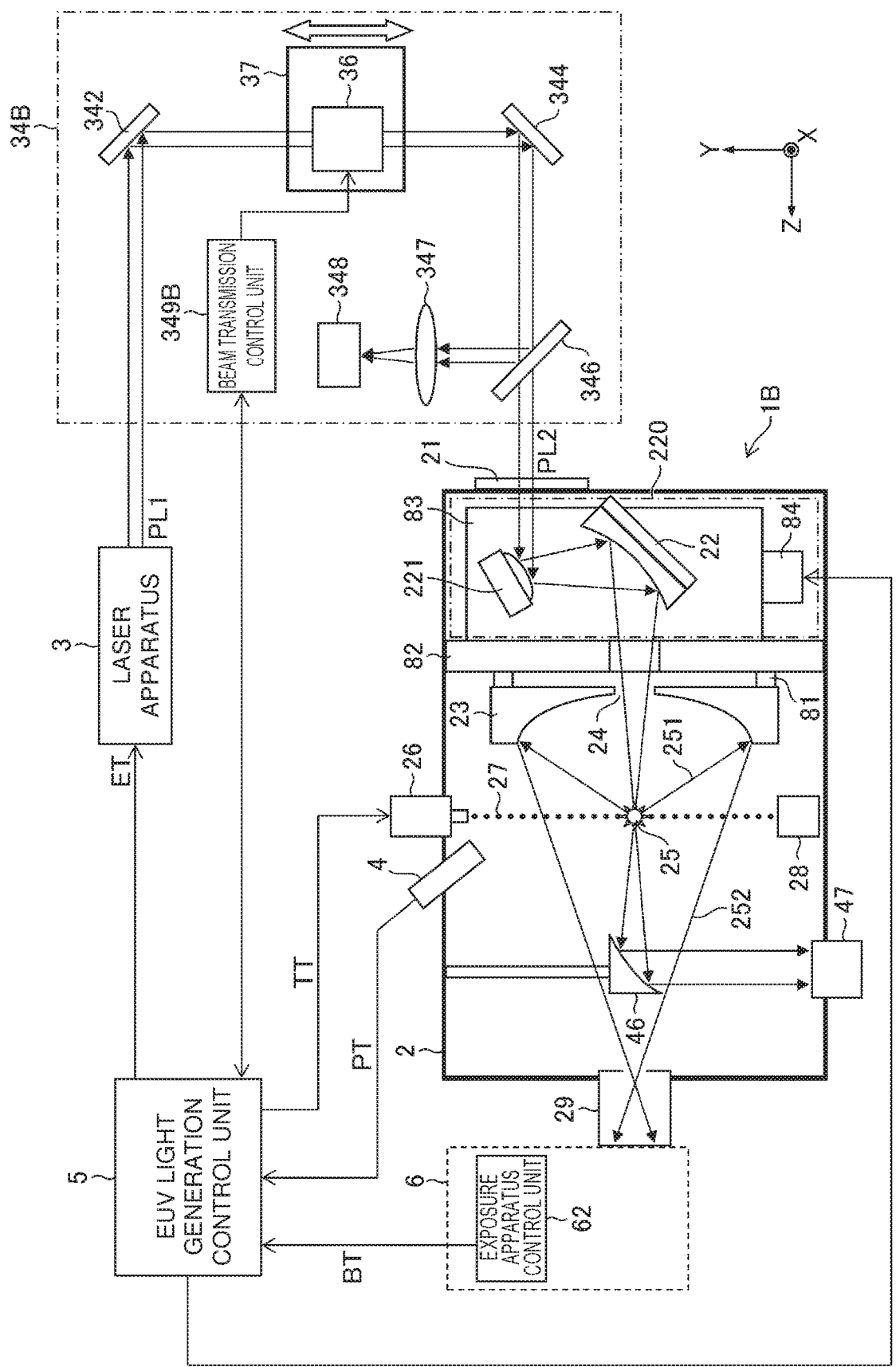
FIG. 14 schematically illustrates the configuration of the EUV light generation apparatus according to Embodiment 2.

FIG. 14 schematically illustrates the configuration of an EUV light generation apparatus 1B according to Embodiment 2. In the configuration of the EUV light generation apparatus 1B according to Embodiment 2, any difference from the EUV light generation apparatus 1A according to Embodiment 1 will be mainly described. As illustrated in FIG. 14, the EUV light generation apparatus 1B according to Embodiment 2 includes a beam transmission device 34B in place of the beam transmission device 34A in FIG. 4. The beam transmission device 34B includes a mirror unit 36 equipped with a focal length change mechanism in place of the configuration of the curvature mirror 35 in the beam transmission device 34A in FIG. 4, and additionally includes a movement stage 37 as a movement mechanism configured to move the mirror unit 36 in an optical axial direction, and a beam transmission control unit 349B. The mirror unit 36 is an exemplary "curvature mirror" in the present disclosure.

The mirror unit 36 and the movement stage 37 are connected with the beam transmission control unit 349B. The beam transmission control unit 349B is connected with the EUV light generation control unit 5.

6.2 Exemplary Mirror Unit Equipped with Focal Length Change Mechanism

6.2.1 Specific Example 1

Figure 15:
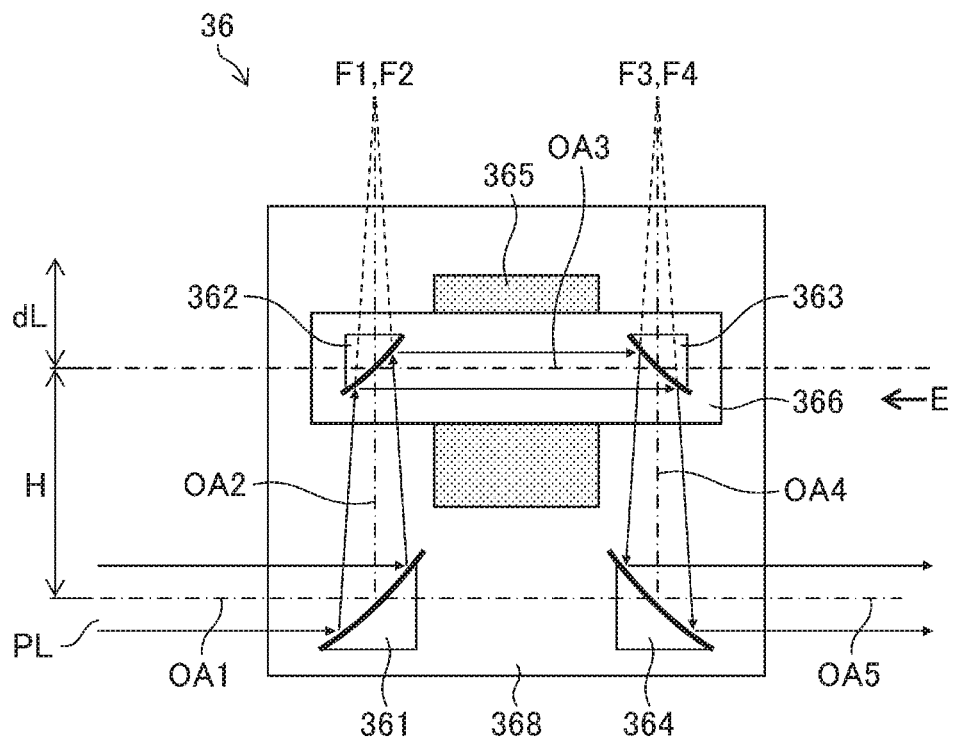
FIG. 15 schematically illustrates the configuration of a mirror unit equipped with a focal length change mechanism according to Specific Example 1.
Figure 16:
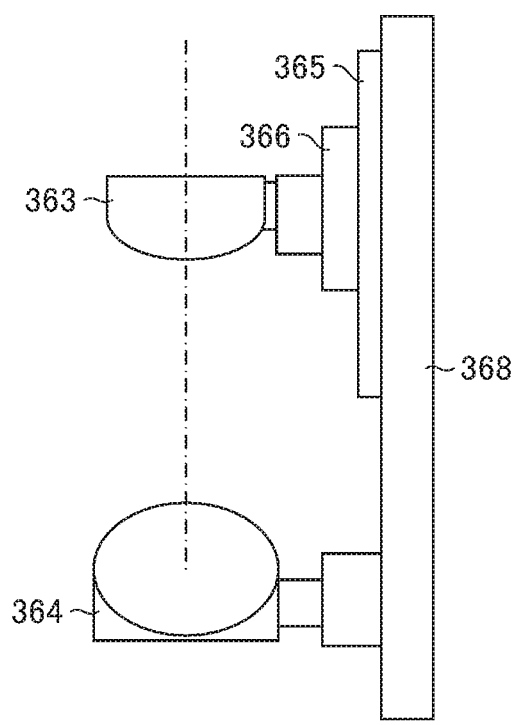
FIG. 16 is an Arrow-E diagram of the mirror unit in FIG. 15 when viewed in the direction of Arrow E.

FIG. 15 schematically illustrates the configuration of the mirror unit 36 equipped with the focal length change mechanism according to Specific Example 1. FIG. 16 is an Arrow-E diagram when viewed in the direction of Arrow E in FIG. 15. The mirror unit 36 includes two concave mirrors 361 and 364 and two convex mirrors 362 and 363. The concave mirror 361, the convex mirror 362, the convex mirror 363, and the concave mirror 364 are disposed in the stated order on the optical path of a pulse laser beam PL.

The concave mirror 361 and the convex mirror 362 form an upstream pair, and the convex mirror 363 and the concave mirror 364 form a downstream pair. In each of the upstream pair and the downstream pair, the concave mirror and the convex mirror may be disposed in the opposite order.

In the state illustrated in FIG. 15, the mirror unit 36 is configured so that a focal point F1 of the concave mirror 361 and a focal point F2 of the convex mirror 362 coincide with each other and a focal point F3 of the convex mirror 363 and a focal point F4 of the concave mirror 364 coincide with each other.

The concave mirrors 361 and 364 and the convex mirrors 362 and 363 are disposed so that an optical axis OA2 between the concave mirror 361 and the convex mirror 362 and an optical axis OA4 between the convex mirror 363 and the concave mirror 364 are parallel to each other.

In addition, the concave mirrors 361 and 364 and the convex mirrors 362 and 363 are disposed so that an optical axis OA1 of the pulse laser beam PL incident on the concave mirror 361, an optical axis OA3 between the convex mirror 362 and the convex mirror 363, and an optical axis OA5 of the pulse laser beam PL from the concave mirror 364 are parallel to one another and so that the optical axis OA1 and the optical axis OA5 are aligned with each other. The angle between the optical axis OA1 and the optical axis OA2 may be right angle.

The distance between the convex mirror 362 and the concave mirror 361 and the distance between the convex mirror 363 and the concave mirror 364 are equal to each other, and these distances are represented by H. The distance H between the convex mirror 362 and the concave mirror 361 may be the distance between a point at which a reflective surface of the concave mirror 361 intersects the optical axis OA2 and a point at which a reflective surface of the convex mirror 362 intersects the optical axis OA2. The mirror unit 36 additionally includes a single-axis movement stage 365, a movement plate 366, and a base plate 368. The single-axis movement stage 365 is an electric stage including an actuator (not illustrated) and connected with the beam transmission control unit 349B (refer to FIG. 14). The convex mirrors 362 and 363 are fixed on the movement plate 366. The single-axis movement stage 365 is disposed on the base plate 368 and can move the movement plate 366 relative to the base plate 368.

The moving direction of the movement plate 366 is parallel to the optical axis OA2 and the optical axis OA4. The single-axis movement stage 365 is a movement device configured to move the mirrors (convex mirrors 362 and 363) fixed on the movement plate 366.

The concave mirrors 361 and 364 are fixed to the base plate 368. The single-axis movement stage 365 can simultaneously increase or simultaneously decrease the distance H between the convex mirror 362 and the concave mirror 361 and the distance H between the convex mirror 363 and the concave mirror 364.

The movement plate 366 may move in a direction in which the distance H in the state illustrated in FIG. 15 increases by dL or may move in a direction in which the distance H decreases.

The single-axis movement stage 365 moves the movement plate 366 relative to the base plate 368 under control of the beam transmission control unit 349B. The beam transmission control unit 349B increases and decreases the distance H between the concave mirror 361 and the convex mirror 362 by moving the movement plate 366 through the single-axis movement stage 365. The focal length of the mirror unit 36 can be changed by changing the distance H.

The concave mirror 361 in the configuration illustrated in FIGS. 15 and 16 is an exemplary "first mirror" in the present disclosure. The convex mirror 362 is an exemplary "second mirror" in the present disclosure. The convex mirror 363 is an exemplary "third mirror" in the present disclosure. The concave mirror 364 is an exemplary "fourth mirror" in the present disclosure. The movement plate 366 is an exemplary "plate" in the present disclosure. The mechanism configured to change the focal length of the mirror unit 36 through the single-axis movement stage 365 is an exemplary "focal length change mechanism" in the present disclosure.

6.2.2 Specific Example 2

Figure 17:
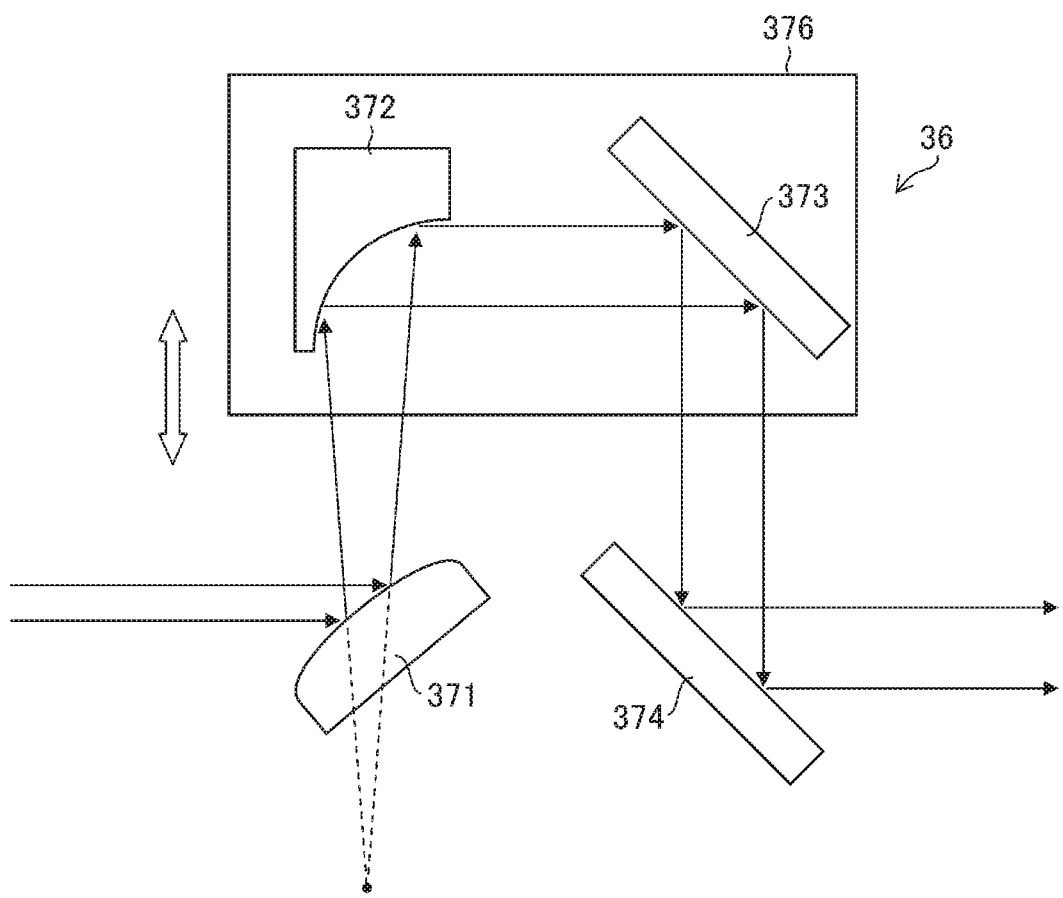
FIG. 17 schematically illustrates the configuration of the mirror unit equipped with the focal length change mechanism according to Specific Example 2.

FIG. 17 schematically illustrates the configuration of the mirror unit 36 equipped with the focal length change mechanism according to Specific Example 2. The mirror unit 36 illustrated in FIG. 17 includes a convex mirror 371, a concave mirror 372, planar mirrors 373 and 374, a mirror fixation plate 376, and a drive mechanism (not illustrated). The convex mirror 371, the concave mirror 372, the planar mirror 373, and the planar mirror 374 are disposed in the stated order on the laser beam path.

The convex mirror 371 is fixed by a mirror holder (not illustrated) at a position where a pulse laser beam is incident. The convex mirror 371 reflects the pulse laser beam toward the concave mirror 372.

The reflected light from the convex mirror 371 may be adjustable so that the reflected light can be regarded as light having a wavefront equivalent to that of light radiated from the position of the focal point of the concave mirror 372.

The concave mirror 372 is fixed to the mirror fixation plate 376 through a mirror holder (not illustrated) so that the concave mirror 372 is movable along the optical path of the pulse laser beam reflected by the convex mirror 371. The concave mirror 372 reflects, toward the planar mirror 373, the pulse laser beam reflected by the convex mirror 371.

The planar mirror 373 is fixed to the mirror fixation plate 376 through a mirror holder (not illustrated) so that the planar mirror 373 is movable together with the concave mirror 372. The mirror fixation plate 376 is movable by the drive mechanism in the up-down direction in the sheet of FIG. 17. The bidirectional arrow illustrated in FIG. 17 indicates the direction of movement of the mirror fixation plate 376 by the drive mechanism. The configuration of the mechanism configured to move the mirror fixation plate 376 may be similar to the configurations of the movement plate 366, the single-axis movement stage 365, and the base plate 368, which are exemplarily illustrated in FIG. 15.

The planar mirror 373 illustrated in FIG. 17 reflects, toward the planar mirror 374, the laser beam reflected by the concave mirror 372. The planar mirror 374 is fixed by a mirror holder (not illustrated) on the optical path of the pulse laser beam reflected by the planar mirror 373.

The planar mirror 374 reflects, toward the propagation mirror 344, the laser beam reflected by the planar mirror 373. The planar mirrors 373 and 374 may be high reflectance mirrors.

The focal length of the mirror unit 36 can be changed by moving the mirror fixation plate 376 through the drive mechanism to increase or decrease the distance between the convex mirror 371 and the concave mirror 372 and the distance between the planar mirror 373 and the planar mirror 374.

The convex mirror 371 in the configuration illustrated in FIG. 17 is an exemplary "first mirror" in the present disclosure. The concave mirror 372 is an exemplary "second mirror" in the present disclosure. The planar mirror 373 is an exemplary "third mirror" in the present disclosure. The planar mirror 374 is an exemplary "fourth mirror" in the present disclosure. The mirror fixation plate 376 is an exemplary "plate" in the present disclosure.

6.2.3 Specific Example 3

Figure 18:
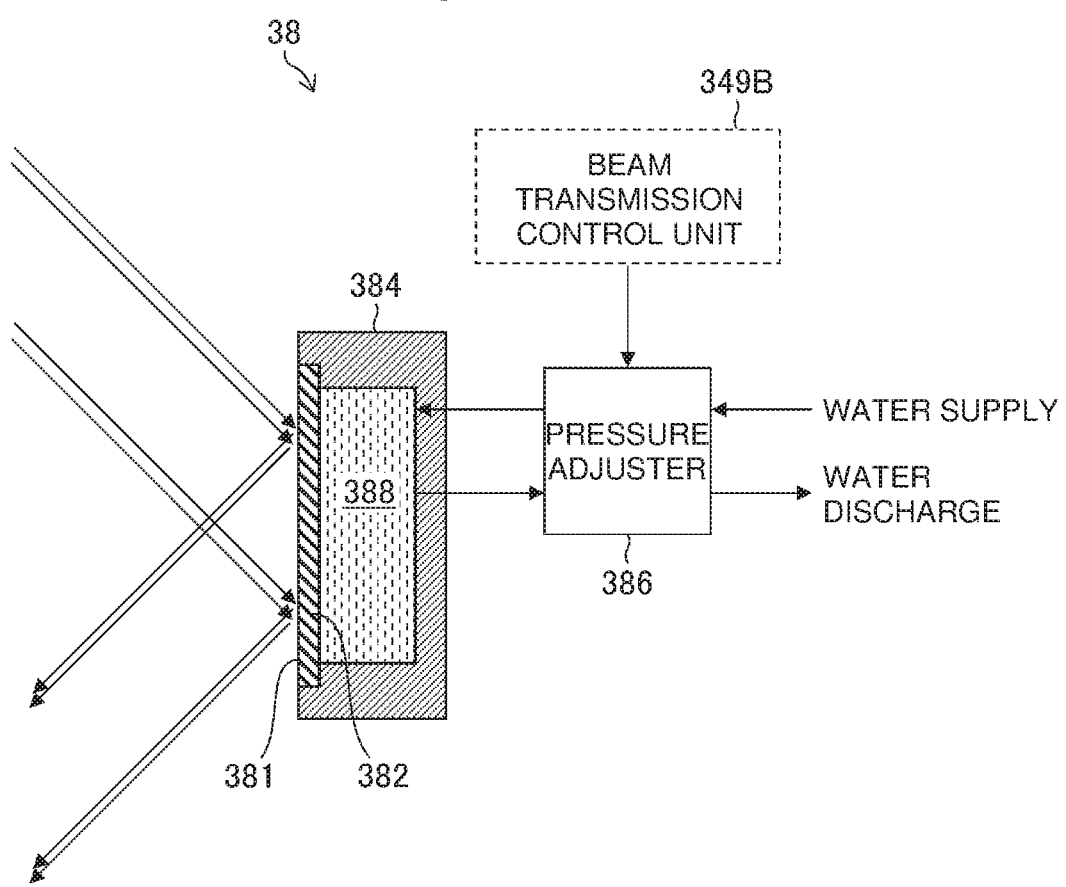
FIG. 18 schematically illustrates a main part of the configuration of the mirror unit equipped with the focal length change mechanism according to Specific Example 3.

FIG. 18 schematically illustrates a main part of the configuration of the mirror unit 36 equipped with the focal length change mechanism according to Specific Example 3. A focal length change mirror 38 illustrated in FIG. 18 includes a deformable member 382 having a high reflection surface 381, a container 384 to which the member 382 is fixed, and a pressure adjuster 386. The high reflection surface 381 is coated with a film configured to highly reflect a pulse laser beam. The container 384 is connected with the pressure adjuster 386 through a pipe (not illustrated). The pressure adjuster 386 is connected with a water supply pipe and a water discharge pipe (not illustrated). The pressure adjuster 386 is connected with the beam transmission control unit 349B.

The pressure adjuster 386 controls supply of water 388 to the container 384 and discharge of the water 388 from the container 384 in accordance with a command from the beam transmission control unit 349B. The pressure of the water 388 in the container 384 is controlled by the pressure adjuster 386 to deform the high reflection surface 381 so that the focal length of the focal length change mirror 38 is changed. Fluid supplied to the container 384 to deform the high reflection surface 381 is not limited to the water 388 but may be other liquid or gas.

The focal length change mirror 38 may be used in place of, for example, any of the second off-axis parabolic concave mirror 352 in FIG. 6, the first spherical surface concave mirror 353 and the second spherical surface concave mirror 354 in FIG. 7, and the second spherical surface concave mirror 354 in FIG. 8.

6.3 Operation

The beam transmission control unit 349B performs control to change the focal length of the mirror unit 36. In addition, the beam transmission control unit 349B can control the movement stage 37 to move the mirror unit 36 in the optical axial direction.

The focal length of the mirror unit 36 equipped with the focal length change mechanism corresponds to the focal length f1 of the curvature mirror 35 described in Embodiment 1. The mirror unit 36 in Embodiment 2 can change the focal length f1.

In addition, the distance from the laser emission port of the laser apparatus 3 to the curvature mirror 35 can be changed by moving the mirror unit 36 in the optical axial direction through the movement stage 37.

6.4 Effect

According to Embodiment 2, even when characteristics of the pulse laser beam PL1 output from the laser apparatus 3 are largely changed due to replacement of the laser apparatus 3 or the like, it is possible to select a focal length with which the beam spread angle of the pulse laser beam from the mirror unit 36 does not change in effect between the cold duration and the hot duration.

According to Embodiment 2, it is possible to reduce variation in the beam size of the pulse laser beam incident on the target 27 without replacing a curvature mirror.

In addition, the distance from the laser emission port of the laser apparatus 3 to the curvature mirror 35 can be changed by the movement stage 37, and thus the beam size at the target irradiation position can be changed.

6.5 Modification

In Embodiment 2, the mirror unit 36 equipped with the focal length change mechanism and the movement mechanism configured to move the mirror unit 36 in the optical axial direction are provided in combination, but any one of the focal length change mechanism and the movement mechanism may be omitted.

7. Exemplary Configuration of Laser Apparatus

The laser apparatus 3 may include a pre-pulse laser apparatus configured to output a pre-pulse laser beam and a main pulse laser apparatus configured to output a main pulse laser beam. The main pulse laser apparatus may be, for example, a $CO_2$ laser apparatus. Alternatively, the pre-pulse laser beam and the main pulse laser beam may be output from a single laser apparatus.

In an LPP scheme EUV light generation apparatus, a diffused target is formed by irradiating the target 27 in a droplet form with the pre-pulse laser beam and diffusing the target and is then irradiated with the main pulse laser beam. Plasma can be efficiently generated from the target substance through the irradiation of the diffused target with the main pulse laser beam. Accordingly, the efficiency of conversion (CE) from the energy of a pulse laser beam into the energy of EUV light can be increased. The target may be irradiated with a plurality of pre-pulse laser beams before the irradiation with the main pulse laser beam.

The target 27 illustrated in FIG. 9 is, for example, the diffused target, and the conditions expressed by Expressions (7) and (8) described above in the embodiments apply to the main pulse laser beam.

8. Exemplary Application as Designing Support System

The method of selecting the focal length f1 of the curvature mirror 35 or the mirror unit 36, which is described in Embodiments 1 and 2, may be implemented as a designing support computer program configured to perform processing of measuring or simulating beam behavior (the beam size and the beam spread angle) on the beam propagation optical path of a pulse laser beam emitted from the laser apparatus 3 and selecting the focal length f in optical path designing of the EUV light generation apparatus based on the information thus obtained, or processing of selecting the focal length f and the distance from the laser emission port of the laser apparatus 3 to the curvature mirror 35. A device configured to execute the designing support computer program can be used as a designing support system.

In an exemplary method of actually measuring the beam spread angle, the $1/e^2$ width of the maximum intensity is measured as the beam size through, for example, approximation to a Gaussian beam, and measured values of the beam size at a plurality of positions on the optical path are connected with each other to obtain the beam spread angle.

Figure 19:
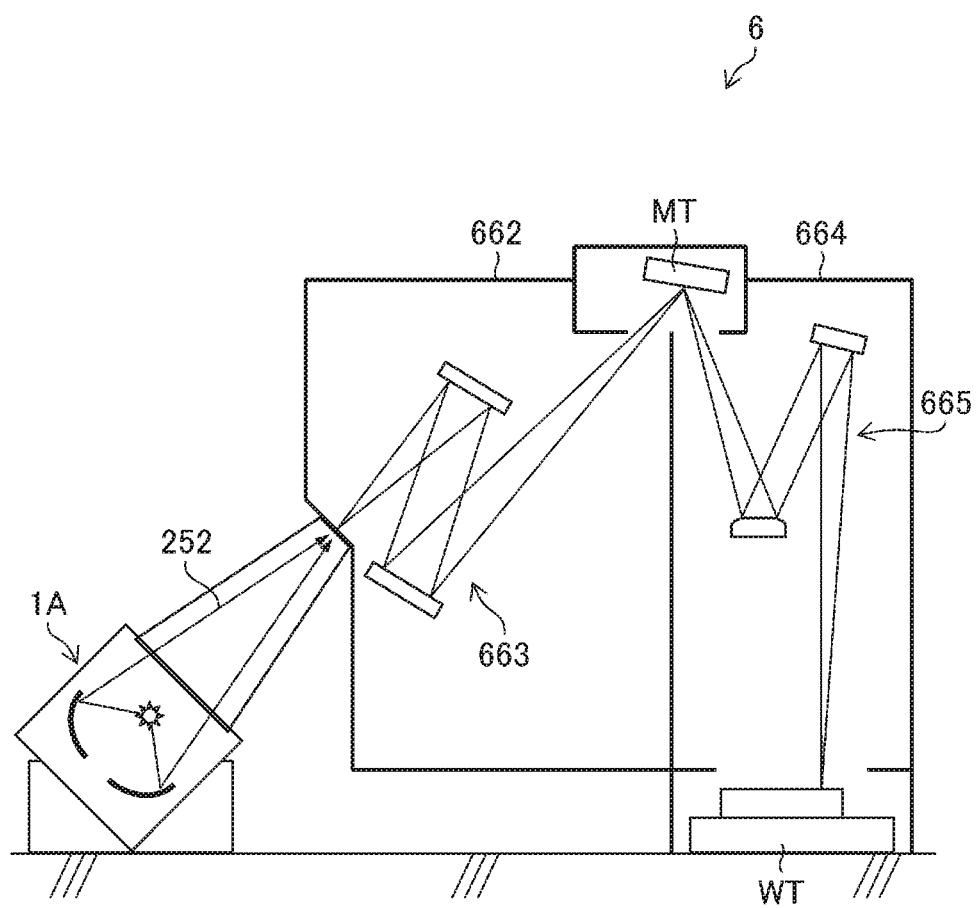
FIG. 19 schematically illustrates the configuration of an exposure apparatus connected with the EUV light generation apparatus.

9. Exemplary Electronic Device Manufacturing Method Using EUV Light Generation Apparatus FIG. 19 is a diagram illustrating a schematic configuration of an exposure apparatus connected with an EUV light generation apparatus. In FIG. 19, the exposure apparatus 6 includes a mask irradiation unit 662 and a workpiece irradiation unit 664. The mask irradiation unit 662 illuminates a mask pattern on a mask table MT with the EUV light 252 incident from the EUV light generation apparatus 1A through a reflection optical system 663. The EUV light generation apparatus 1A may be the EUV light generation apparatus 1B described in Embodiment 2.

The workpiece irradiation unit 664 images the EUV light 252 reflected by the mask table MT onto a workpiece (not illustrated) disposed on a workpiece table WT through a reflection optical system 665.

The workpiece is a photosensitive substrate such as a semiconductor wafer on which photoresist is applied. The exposure apparatus 6 translates the mask table MT and the workpiece table WT in synchronization to expose the workpiece to the EUV light reflected by the mask pattern.

After the mask pattern is transferred onto the semiconductor wafer through an exposure process as described above, a plurality of processes are performed to manufacture a semiconductor device. The semiconductor device is an exemplary "electronic device" in the present disclosure.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments and variations of the present disclosure would be appropriately combined.

The terms used throughout the present specification and the appended claims should be interpreted as non-limiting terms unless stated otherwise. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. A beam delivery system that guides, to a condensation optical system, a pulse laser beam emitted from a laser apparatus and is used for an extreme ultraviolet light generation apparatus configured to generate extreme ultraviolet light by irradiating a target substance with the pulse laser beam through the condensation optical system, the beam delivery system comprising:
a propagation mirror disposed on an optical path between the laser apparatus and the condensation optical system and configured to change a propagation direction of the pulse laser beam; and
a curvature mirror disposed on an optical path between the propagation mirror and the condensation optical system and having a concave reflective surface configured to convert the pulse laser beam to be incident on the condensation optical system into a convergent beam,
the curvature mirror having a focal length selected so that the pulse laser beam as the convergent beam from the curvature mirror has a beam spread angle that is constant irrespective of thermal deformation of the propagation mirror or constant with change in a predetermined allowable range irrespective of thermal deformation of the propagation mirror.

2. The beam delivery system according to claim 1, wherein, when a duration of a state in which thermal deformation of the propagation mirror does not occur is defined as a first state duration, and a duration of a state in which thermal deformation of the propagation mirror due to irradiation with the pulse laser beam is stationary is defined as a second state duration, a relation below is satisfied:

$$f1 = \Delta BPm/2 \cdot \Delta BDm$$

where f1 represents the focal length of the curvature mirror, $\Delta BPm$ represents an amount of change in the beam size of the pulse laser beam at a position of the curvature mirror between the first state duration and the second state duration, and $\Delta BDm$ represents an amount of change in the beam spread angle of the pulse laser beam incident at the position of the curvature mirror between the first state duration and the second state duration.

3. The beam delivery system according to claim 1, wherein the predetermined allowable range is a range of −10% to 10% inclusive.

4. The beam delivery system according to claim 1, wherein the focal length of the curvature mirror is selected so that:

$$0.9 \cdot BDcc < BDch < 1.1 \cdot BDcc$$

is satisfied where
BDcc represents the beam spread angle of the pulse laser beam from the curvature mirror in a first state duration as a state in which thermal deformation of the propagation mirror does not occur, and
BDch represents the beam spread angle of the pulse laser beam from the curvature mirror in a second state duration as a state in which thermal deformation of the propagation mirror is stationary due to irradiation with the pulse laser beam.

5. The beam delivery system according to claim 4, wherein $$BDcc=(-BPm+2 \cdot f1 \cdot BDm)/(2 \cdot f1)$$

$$BDch=\{-(BPm+\Delta BPm)+2 \cdot f1 \cdot (BDm+\Delta BDm)\}/(2 \cdot f1)$$

are satisfied where
f1 represents the focal length of the curvature mirror,
BPm represents a beam size of the pulse laser beam at a position of the curvature mirror in the first state duration,
ΔBPm represents an amount of change in the beam size of the pulse laser beam at the position of the curvature mirror between the first state duration and the second state duration,
BDm represents the beam spread angle of the pulse laser beam incident at the position of the curvature mirror in the first state duration, and
ΔBDm represents an amount of change in the beam spread angle of the pulse laser beam incident at the position of the curvature mirror between the first state duration and the second state duration.

6. The beam delivery system according to claim 4, wherein, in the first state duration, the propagation mirror is at room temperature.

7. The beam delivery system according to claim 1, wherein a focal point of the pulse laser beam through the condensation optical system is at a position on a near side of a position at which the target substance is irradiated with the pulse laser beam.

8. The beam delivery system according to claim 1, wherein the curvature mirror is a mirror unit constituted by combining a plurality of concave mirrors.

9. The beam delivery system according to claim 1, wherein the curvature mirror is a mirror unit constituted by combining a planar mirror and a concave mirror.

10. The beam delivery system according to claim 1, further comprising a movement mechanism configured to move the curvature mirror in an optical axial direction.

11. The beam delivery system according to claim 1, further comprising a focal length change mechanism capable of changing the focal length of the curvature mirror.

12. The beam delivery system according to claim 11, wherein
the curvature mirror is a mirror unit including a first mirror, a second mirror, a third mirror, and a fourth mirror disposed on an optical path in the stated order,
the focal length change mechanism includes
a plate to which the second mirror and the third mirror are fixed, and
a single-axis movement stage configured to move the second and third mirrors fixed to the plate, and
the single-axis movement stage is capable of changing a focal length of the mirror unit by changing a distance between the first and second mirrors and a distance between the third and fourth mirrors.

13. The beam delivery system according to claim 12, wherein
the first and fourth mirrors are each a concave mirror, and
the second and third mirrors are each a convex mirror.

14. The beam delivery system according to claim 12, wherein
the first mirror is a convex mirror,
the second mirror is a concave mirror, and
the third and fourth mirrors are each a planar mirror.

15. The beam delivery system according to claim 11, wherein
the focal length change mechanism includes
a deformable member having a reflection surface coated with a film that reflects the pulse laser beam,
a container holding the deformable member, and
a pressure adjuster configured to adjust fluid pressure in the container by controlling supply of fluid into the container and discharge of the fluid from the container, and
the fluid pressure is adjusted to deform the reflection surface and change the focal length.

16. A method of selecting a focal length of a curvature mirror included in a beam delivery system that guides, to a condensation optical system, a pulse laser beam emitted from a laser apparatus and is used for an extreme ultraviolet light generation apparatus configured to generate extreme ultraviolet light by irradiating a target substance with the pulse laser beam through the condensation optical system,
the beam delivery system having a configuration in which
a propagation mirror configured to change a propagation direction of the pulse laser beam is disposed on an optical path between the laser apparatus and the condensation optical system, and
the curvature mirror having a concave reflective surface is disposed on an optical path between the propagation mirror and the condensation optical system so that a convergent beam from the curvature mirror is incident on the condensation optical system,
the curvature mirror having a focal length selected so that the pulse laser beam as the convergent beam from the curvature mirror has a beam spread angle that is constant irrespective of thermal deformation of the propagation mirror or constant with change in a predetermined allowable range irrespective of thermal deformation of the propagation mirror.

17. The focal length selecting method according to claim 16, wherein the focal length of the curvature mirror is selected so that:

$$0.9 \cdot BDcc < BDch < 1.1 \cdot BDcc$$

is satisfied where
BDcc represents the beam spread angle of the pulse laser beam from the curvature mirror in a first state duration as a state in which thermal deformation of the propagation mirror does not occur, and
BDch represents the beam spread angle of the pulse laser beam from the curvature mirror in a second state duration as a state in which thermal deformation of the propagation mirror is stationary due to irradiation with the pulse laser beam.

18. The focal length selecting method according to claim 17, wherein, when f1 represents the focal length of the curvature mirror, BPm represents a beam size of the pulse laser beam at a position of the curvature mirror in the first state duration, ΔBPm represents an amount of change in the beam size of the pulse laser beam at the position of the curvature mirror between the first state duration and the second state duration, BDm represents the beam spread angle of the pulse laser beam incident at the position of the curvature mirror in the first state duration, and ΔBDm represents an amount of change in the beam spread angle of the pulse laser beam incident at the position of the curvature mirror between the first state duration and the second state duration, the focal length f1 of the curvature mirror is selected by using a relation:

$$BDcc=(-BPm+2 \cdot f1 \cdot BDm)/(2 \cdot f1)$$

$$BDch=\{-(BPm+\Delta BPm)+2 \cdot f1 \cdot (BDm+\Delta BDm)\}/(2 \cdot f1).$$

19. An electronic device manufacturing method comprising:

generating extreme ultraviolet light with an extreme ultraviolet light generation apparatus including a condensation optical system configured to condense a pulse laser beam emitted from a laser apparatus, a propagation mirror disposed on an optical path between the laser apparatus and the condensation optical system and configured to change a propagation direction of the pulse laser beam, and a curvature mirror disposed on an optical path between the propagation mirror and the condensation optical system and having a concave reflective surface configured to convert the pulse laser beam to be incident on the condensation optical system into a convergent beam, the curvature mirror having a focal length selected so that the pulse laser beam as the convergent beam from the curvature mirror has a beam spread angle that is constant irrespective of thermal deformation of the propagation mirror or constant with change in a predetermined allowable range irrespective of thermal deformation of the propagation mirror, by guiding, to the condensation optical system, the pulse laser beam emitted from the laser apparatus and irradiating a target substance with the pulse laser beam through the condensation optical system;

outputting the extreme ultraviolet light to an exposure apparatus; and exposing a photosensitive substrate to the extreme ultraviolet light in the exposure apparatus to manufacture an electronic device.

* * * * *